United States Patent [19]
Schwob

[11] Patent Number: 5,152,011
[45] Date of Patent: Sep. 29, 1992

[54] BROADCAST RECEIVER CAPABLE OF AUTOMATIC STATION IDENTIFICATION AND FORMAT-SCANNING BASED ON AN INTERNAL DATABASE UPDATABLE VIA DATA RECEPTION OVER THE AIRWAVES

[76] Inventor: Pierre R. Schwob, 257 Central Park W., New York, N.Y. 10024-4108

[21] Appl. No.: 540,130

[22] Filed: Jun. 19, 1990

Related U.S. Application Data

[63] Continuation-in-part of Ser. No. 515,629, Apr. 27, 1990, which is a continuation-in-part of Ser. No. 212,863, Jun. 29, 1988, Pat. No. 4,969,209, which is a continuation-in-part of Ser. No. 78,286, Jul. 27, 1987.

[51] Int. Cl.⁵ .............................................. H04B 1/08
[52] U.S. Cl. ............................. 455/158.5; 455/161.2; 455/186.1; 358/192.1
[58] Field of Search ................. 455/38, 158, 161, 157, 455/154, 166, 161, 184, 185, 186, 132–136, 158.5, 161.2, 186.1; 358/192.1, 193.1

[56] References Cited

U.S. PATENT DOCUMENTS

| 4,887,308 | 12/1989 | Dutton | 455/186 |
| 4,910,510 | 3/1990 | Dais | 455/38 |
| 5,001,775 | 3/1991 | Hayashi et al. | 455/186 |

*Primary Examiner*—Curtis Kuntz
*Attorney, Agent, or Firm*—Fitzpatrick, Cella, Harper & Scinto

[57] ABSTRACT

A broadcasting system capable of automatically or semi-automatically updating its database and using the database to identify received broadcasting stations, and search for stations according to user-chosen attributes and current data. The receiver is capable of identifying and searching for, any station in any band the receiver is capable of receiving.

10 Claims, 23 Drawing Sheets

FIG. 10.

| FORMAT | LAST STATION |
|---|---|
| 1001 | 1002 |

FIG. 11.

H=HIGH GRID [Header(95)]

| 1450 | 1449 | ... | | | | | | | ... | 1394 | 1393 |
|---|---|---|---|---|---|---|---|---|---|---|---|
| 1392 | | | | | | | | | | | 1335 |
| | | | | | USA | | | | | | |
| ... | | | | | | | | | | | ... |
| 116 | | | | | | | | | | | 59 |
| 58 | 57 | | | | | | | | | 2 | 1 |

L=LATITUDE INCREMENT [Header(98)]

| IF P<=H-L AND FRAC (P/L)<>0<br>NW<br>THEN P=P+L+1 | IF P<=H-L<br>N<br>THEN P=P+L | IF P<=H-L AND FRAC (P-1/L)<>0<br>NE<br>THEN P=P+L-1 |
|---|---|---|
| IF FRAC (P/L)<>0<br>W<br>THEN P=P+1 | CURR. POSITION<br>P | IF FRAC (P-1/L)<>0<br>E<br>THEN P=P-1 |
| IF P>L AND FRAC (P/L)<>0<br>SW<br>THEN P=P-L+1 | IF P>L<br>S<br>THEN P=P-L | IF P>L AND FRAC (P-1/L)<>0<br>SE<br>THEN P=P-L-1 |

AUTOMATIC RECEIVER LOCATION UPDATE

BROADCAST RECEIVER CAPABLE OF AUTOMATIC STATION IDENTIFICATION AND FORMAT-SCANNING BASED ON AN INTERNAL DATABASE UPDATABLE VIA DATA RECEPTION OVER THE AIRWAVES

This application is a continuation-in-part of copending application Ser. No. 07/515,629 for BROADCAST RECEIVER CAPABLE OF AUTOMATICALLY UPDATING LOCATION AND PERFORMING SPIRAL SEARCHING filed on Apr. 27, 1990, which is a continuation-in-part of co-pending application Ser. No. 212,863 for BROADCAST RECEIVER CAPABLE OF SELECTING STATIONS BASED UPON GEOGRAPHICAL LOCATION AND PROGRAM FORMAT filed on Jun. 29, 1988 now U.S. Pat. No. 4,109,209, which is a continuation-in-part of application Ser. No. 078,286 for DISPLAY FOR RADIO RECEIVER filed Jul. 27, 1987.

BACKGROUND OF THE INVENTION

There are, of course, numerous devices for conveying, particularly with displays, information to the users of broadcast receivers, particularly, home and auto radio receivers. Such displays have taken the form of 7-segment gas diodes, light emitting diodes and even liquid crystal display panels to provide the user information about the frequency of the station to which he is listening. An example of a liquid crystal display is shown in the U.S. Pat. No. 4,040,719 to Schiebelhuth. Another such patent is the U.S. Pat. No. No. 4,123,714 to Oshawa. In this patent, the liquid crystal display merely advises the user whether the broadcast is stereo or monaural. Still another patent concerned with displaying the broadcast frequency to the user is the U.S. Pat. No. No. 4,495,651 to Froeliger.

A conventional scanning receiver is one which can be operated to scan over a portion of the broadcast frequency spectrum to stop at a received station having a sufficient signal strength and permit a user to listen to or watch that station. Such receives, for instance, are often provided in vehicles and operated to scan either AM or FM bands to stop at the first station received for a period of time to permit the user to decide if the station received is one he wants to listen to or to let the scanning operation resume.

There are currently several systems which are used to provide automatic station-identification of broadcast stations on a broadcast receiver. Reference is made in particular to the ID LOGIC system as described in application Ser. No. 07/078,286 for DISPLAY FOR RADIO RECEIVER filed Jul. 27, 1987 and its Continuation-In-Part U.S. Pat. applications Ser. No. 212,863 for BROADCAST RECEIVER CAPABLE OF SELECTING STATIONS BASED UPON GEOGRAPHICAL LOCATION AND PROGRAM FORMAT filed on Jun. 29, 1988 and Ser. No. 07/515,629 for BROADCAST RECEIVER CAPABLE OF AUTOMATICALLY UPDATING LOCATION AND PERFORMING SPIRAL SEARCHING filed on Apr. 27, 1990, as well as the RADIO DATA SYSTEM (RDS) as published in the public domain in the Technical Journal Tech. 3244-E titled SPECIFICATIONS OF THE RADIO DATA SYSTEM RDS FOR VHF/FM SOUND BROADCASTING by the European Broadcasting Union.

The later publication is directed to a system in which digital coded data containing, amongst other things, the broadcasting station information is sent via an FM subcarrier along with main program contents. This subcarrier digital data is then decoded at the receiver for display on the receiver display means. The limitation of this system stems from three problems: (1) this system can only perform adequately in the FM band; (2) to be effective, every FM radio station must be equipped with a subcarrier encoding system; and (3) format-scanning is only possible after the receiver has interrogated all of the FM stations in its receiving range.

The ID LOGIC system, on the other hand, is based on a large internal preprogrammed database in a memory means such as a Read-Only Memory (ROM) which can contain station information for all stations in all bands. ID LOGIC can therefore operate in all bands without restrictions and perform format-scanning instantaneously, which is a great advantage to the user. The weakness of a system without the present invention stems from the fact that the database must be updated manually by the user—either by replacing the memory means containing the database, or by entering updated data in a memory means such as a Random Access Memory (RAM) via the front panel—the RAM data is then used by the controlling processor in place of the information in the ROM.

As broadcasters sometimes spend great sums of money to advertise format, call-letter changes and other changes pertaining to their broadcasting stations, and since receiver users will want the data stored in their receivers to reflect the latest changes in their markets, it is desirable to offer a system in which stored data can be updated as soon and as easily as practicable.

The present invention provides a means to update a receiver-integrated database containing station identification and station attribute information so that data update can be done automatically or semi-automatically through VHF/FM subcarrier data transmission as soon as a data change is known and as easily as practicable. The real benefit of the invention stems from the fact that not only the data for the station being tuned to is updated, but also the data for stations which may not have subcarrier-capable transmission capability, such as stations transmitting in a band where subcarrier data transmission is impracticable (such as in the AM band) or stations which have not made the capital expenditure necessary for the installation of such subcarrier data transmission capability.

The recent deregulation of broadcast subcarrier usage has spurred a new interest in using subcarrier for data transmission and paging services in addition to the more conventional audio services. FM and TV stations are now permitted to use up to two additional audio or data channels on the main carrier of the station. Subcarriers added to FM broadcast stations include Subsidiary Communications Authorizations (SCA) while subcarriers added to a TV station's aural carrier include a Secondary Audio Program (SAP) or a non-public channel for Professional use (PRO).

SUMMARY OF THE INVENTION

The usefulness and attractiveness of receivers using internal data storage means that are capable of automatically identifying a received station and performing format-scanning can be enhanced considerably by the provision of an automatic updating procedure which allows the data stored in the receiver to be easily updated, thereby affording up to date data which is comparable to the RDS system but which removes the shortcomings of that RDS system.

Therefore it is an object of this invention to provide a novel receiver capable of conveying to the user the salient and timely information relating to the broadcasting stations the user may want to tune to or may be tuned to.

It is another object of this invention to provide this timely data for broadcasting stations in all the bands the receiver can receive.

It is another object of this invention to provide a format- or other attribute-scanning capability based on timely information for all bands.

It is another object of this invention to provide an automatic or quasi-automatic data updating system based on subcarrier technology or other on-the-air data transmission techniques.

DESCRIPTION OF THE DRAWINGS

The invention itself is set forth in the claims appended hereto and forming a part of this specification, while an understanding of embodiments thereof may be had by reference to the detailed description taken in conjunction with the drawings in which:

FIG. 10 is a drawing showing a data structure for FORMAT fields 919 and 924 shown in FIG. 9;

FIG. 11 is a drawing showing an example of a grid matrix map for the United States;

DETAILED DESCRIPTION OF THE PREFERRED EMBODIMENTS

I. RADIO RECEIVER

Figure 1:
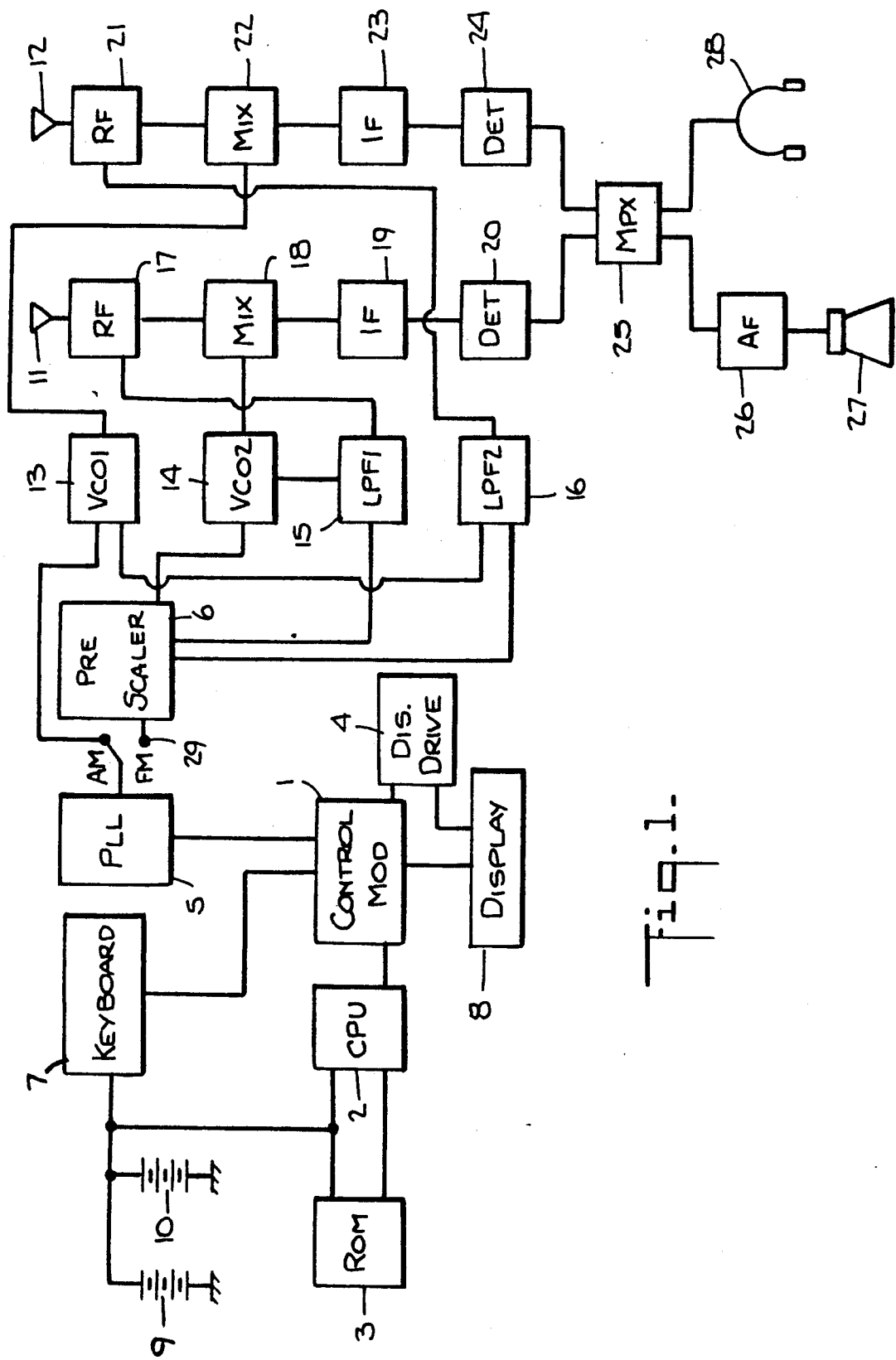
FIG. 1 is a block diagram illustrating a radio receiver in accordance with the invention.

Referring first to FIG. 1 of the drawings, a radio receiver in accordance with the invention includes a control module 1. In this embodiment, the control module is constituted by a one-chip CPU such as the T-18 manufactured by Toshiba and is described in the published technical data for this chip. It includes as a program memory a ROM, a RAM data memory together with a liquid crystal display driver circuit, input/output ports and timing oscillators. As will be described hereinafter various inputs are provided for the T-18 chip.

The receiver itself includes the usual radio frequency and audio frequency circuits for both AM and FM. The FM circuit includes an antenna 11 for connection to a RF radio frequency section 17, the output of which in turn is connected to a mixer 18. The output of the mixer is supplied to an intermediate frequency amplifier 19 and its output in turn is supplied to a detector 20. The output of the detector is coupled to a multiplexer 25 which feeds earphones 28 and an audio frequency amplifier 26 that supplies a speaker 27.

A similar circuit is provided for AM signals and is constituted by an antenna 12 for connection to a RF radio frequency section 21 the output of which in turn is connected to a mixer 22. The output of the mixer is supplied to an intermediate frequency amplifier 23 and its output in turn is supplied to a detector 24. As before, the output of the detector is coupled to the multiplexer 25 which feeds earphones 28 and an audio frequency amplifier 26 that supplies the speaker 27.

Tuning of the radio is accomplished through the provision of a phase-lock-loop (PLL) chip 5. The PLL receives input signals from the control module 1 which signals determine the frequency of the output of the chip 5. A phase-lock-loop chip suitable for this purpose is the Toshiba TC9125BP in conjunction with a prescaler 6 such as the Toshiba TD6129P chip for the purpose of dividing, when in the FM mode, the output of a voltage-controlled oscillator (VC02) 14. A switch 29 is provided to switch the input of the chip 5 from the prescaler when FM is desired. Otherwise, the chip 5 is connected directly to a voltage-controlled oscillator (VC01) 13. The PLL chip 5 also supplies output voltage to low pass filters (LPF1) 15 and (LPF2) 16 which feedback on the VC01 13 and VC02 14 to ensure that the mixers 18 and 22 continue to produce the desired intermediate frequency for the amplifiers 19 and 23. The low pass filters (LPFl) 15 and (LPF2) 16 also provide the tuning signal for the RF receivers 17 and 21.

In the operation of a digital tuning module (DTM), the control module 1 supplies signals indicating the lock frequency that is the frequency of the station desired and the mode selection, that is whether the signal desired is the AM signal or the FM signal. As will be explained hereinafter the control unit is programmed to wait there a predetermined period, for instance 100 MS, and if within that period it receives a signal back indicating that the desired radio frequency has been received, no further signal will be sent from the control unit and the radio will operate to permit the reception of that signal. If within that period, no acknowledgement is received by the control unit, the program will direct the control unit to step to the next frequency and try again to determine if a signal is being received. The receiver shown and described is intended as an example that can be used in accordance with the invention and other forms of receivers can be used. For instance, it would be possible to utilize a receiver wherein a digital output of the control module 1 can be utilized in a digital to analog circuit controlling the frequency of local oscillators for the FM and AM circuits for tuning purposes.

In accordance with the invention, a read-only-memory (ROM) 3 is included in order to store information intended to be displayed This information includes the identification of the various broadcasting stations, for instance in the case of United States stations: the frequency of each; the station call letters; the location, that is city and state; and even the format (type of programming). Thus the data stored in memory 3 can indicate on a display 8 whether a particular station in a particular city broadcasts, for example, classical music, country & western, jazz, or other format or type of programming. In the operation of the system, this memory would be addressed by a slave processor or CPU 2 so as to permit the visual display of data, such as that described, as the user tunes the radio or simply turns it on in order to receive a pre-selected station. A ROM 3 suitable for this purpose is the TC531000P chip from Toshiba which can store up to 128 kilobytes of data and which has the advantage of requiring a relatively low power for operation, thus permitting extended use of batteries. A slave processor suitable for this purpose is the MSM6404 chip available from Oki.

In order to display the desired information to the user and to permit programming of the radio, the display 8 is provided and may be of the liquid crystal type. An additional driving element 4 may be provided to enhance the output capacity of the control module 1. An element suitable for this purpose is the T-7724 chip from Toshiba. A keyboard 7 permitting the user to program the receiver is provided and constitutes an input to the control module 1.

Power can be supplied from battery sources 9 and 10 to produce the DC operating and backup voltages required. An optional AC to DC adapter can be provided to permit use without batteries.

The Display

Figure 2:
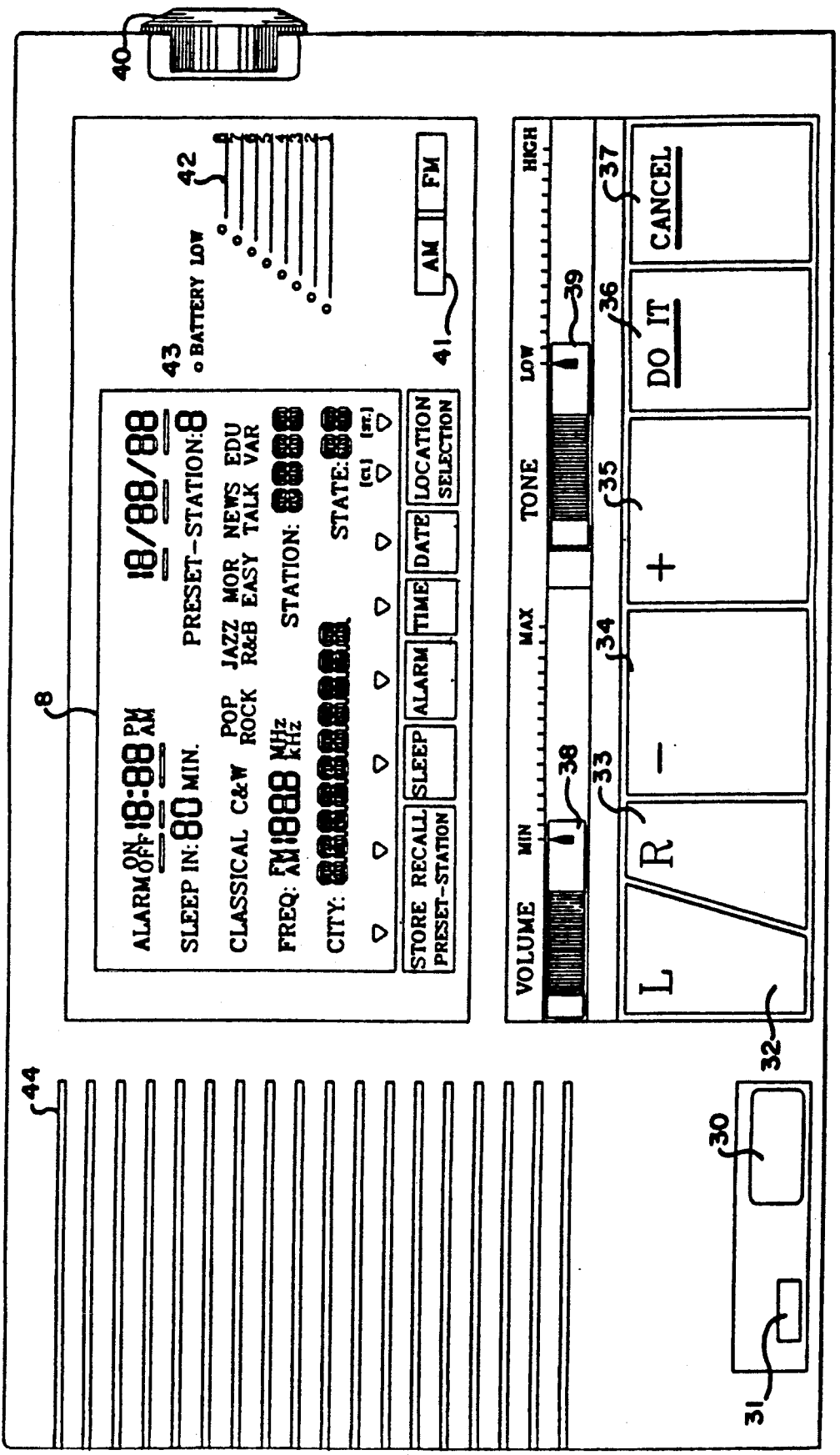
FIG. 2 is an illustration of an embodiment of the front of a receiver which can be used to practice the invention.
Figure 3:
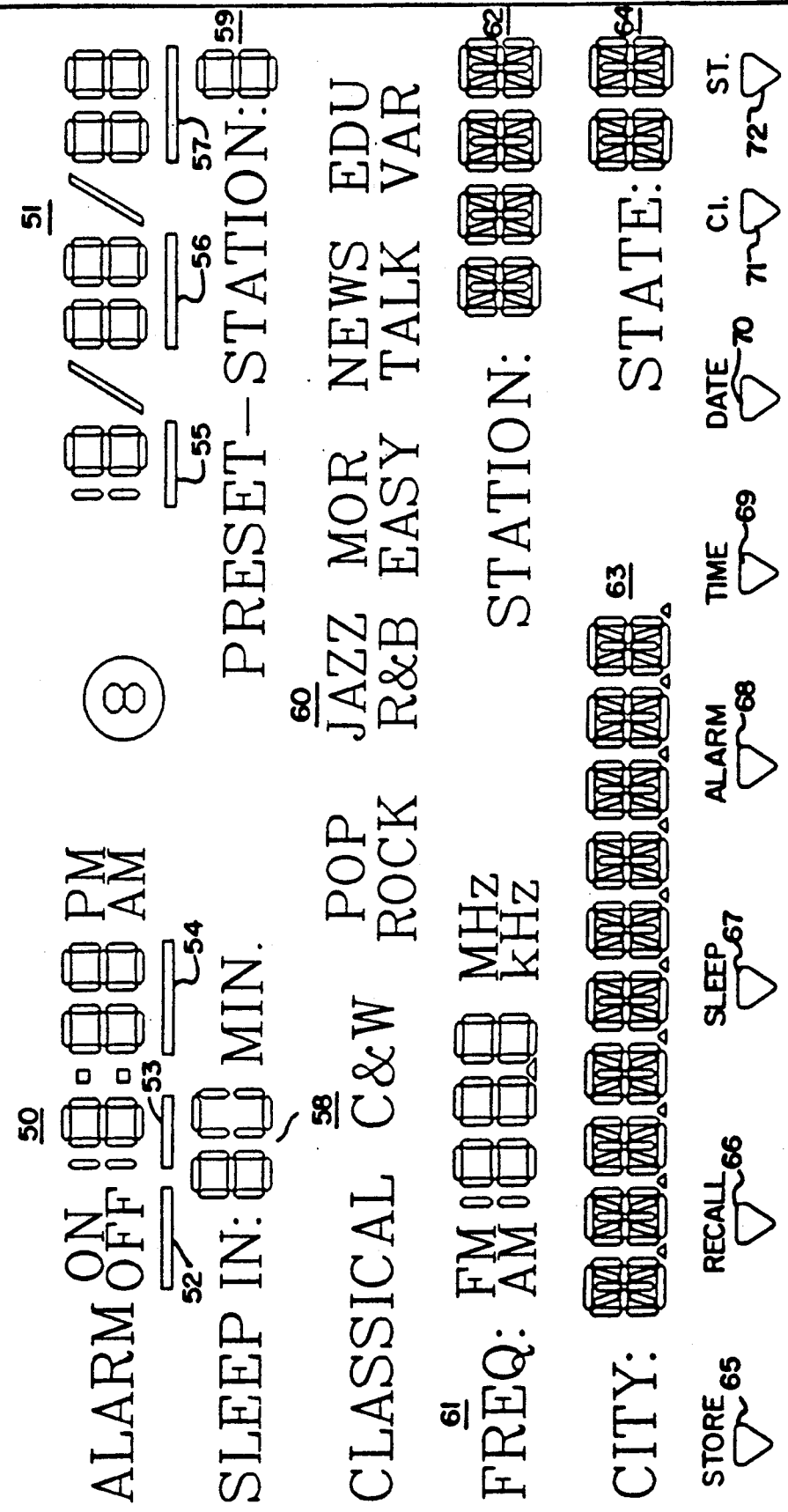
FIG. 3 is an illustration of an embodiment of a liquid crystal display which can be used to practice the invention.

An embodiment of the receiver in accordance with the invention is shown in FIG. 2. An embodiment of the display in accordance with the invention is shown in FIG. 3. Thus, such a receiver includes the speaker 27 mounted behind outlet louvres 44. A digital signal strength meter 42 is shown and can consist of a number of LEDs provided with a scale to show signal strength. A tuning knob 40 may be placed on the side of the receiver. An on/off switch 30 together with a light 31 can be provided toward the bottom of the receiver. Volume control may be provided by the use of a sliding switch 38 cooperating with a scale, while another sliding switch 39 is also provided with a scale for tone control.

The display 8, in addition to the information display capability that will be described, also includes a series of markers 65 to 72 and 52 to 57 (FIG. 3). These markers are used to permit programming of the receiver, whether it is to select the current time and the current date or the current location of the receiver or to preselect or tune to a radio station desired or to select an alarm or circuit to turn the receiver on or off at a predetermined time.

The markers are controlled by the keyboard 7. The keyboard comprises a series of push buttons which may be of the diaphragm type and operates as follows: switch 32 labeled L causes the markers to be sequentially enabled toward the left, that is from 72 toward 65 or 57 toward 52. The switch 33 labeled R causes the markers to be sequentially enabled toward the right. To enter a program of preselected stations, or the time at which an alarm should be activated, or any other data, switches 34 and 35 are provided. The switch 34 with the minus sign causes a decrease of the values or alphabetical data, chosen by the L or R switch, each time it is operated. The switch 35 with the plus sign causes an increase of the values or alphabetical data, chosen by the L or R switch, each time it is operated. The switch 36 labeled "DO IT" will enter into the memory the information displayed and programmed by the use of the switches 32 to 35. Switch 37 labeled "CANCEL" is provided to cancel any unterminated action.

Provided on the display in FIG. 3 are a series of indications 60 of the format (that is, type of programming) conducted by the particular station being received. For example, such formats or types of programming may be classical music, country and western, pop, jazz, news, etc. This display is of particular value when the user is attempting to listen to stations that are unfamiliar to him.

Another section of the display 8 is an indication of the frequency of the station 61 being received, whether it is FM or AM, and whether the number displayed represents MHz or KHz. Also displayed are the call letters of the station 62, as is the city 63 and state 64 wherein the station is located. These city and state displays 63 and 64 are also used to select the location of the receiver.

These elements just described cooperate with the control module 1 and slave module 2 and the data stored in the ROM 3 to permit operation of the system. To achieve this end, a program is written for the control module 1 and the slave module 2 providing the basic control intelligence. Such programs can be written using well known computer languages and techniques and would include the capability of controlling and displaying the markers and alphanumerical displays in response to the actuation of the switches 32 to 37. The stored program can also provide the required phase-lock frequency parameters to the PLL chip 5. Likewise the program will access the database stored in the ROM chip 3.

Current Location Setting

The markers 71 and 72 are used to select a state and a city within that state when the receiver is moved to a different location, so that tuning or presetting within that new location may be accomplished as described above. In this case, the cities and states will be shown in alphabetical order in the displays 63 and 64 and the user can, by operating the keys 34 and 35, change the city and/or state displayed, thereby, permitting a new portion of the database in memory 3 to be activated.

Station Selection

In the use of the receiver, after it has been turned on by the user and its location has been set, and it is desired to select a station to be listened to, either the minus switch 34 or the plus switch 35 can be depressed or the dial 40 can be rotated causing the frequency to change either in the upward or downward direction. The program is such that if either switch 34 or 35 is depressed for a longer period than a predetermined period of time, the receiver will go into an automatic scanning mode. In such mode, upon receiving a signal of sufficient strength, the receiver will stop the scan at that station and, if available, display the call letters of the station together with information about its geographic location and its broadcasting format. If this station is not what the user wishes, depressing either switch 34 or 35 will cause the receiver to scan for the next station.

TV RECEIVER

Figure 17:
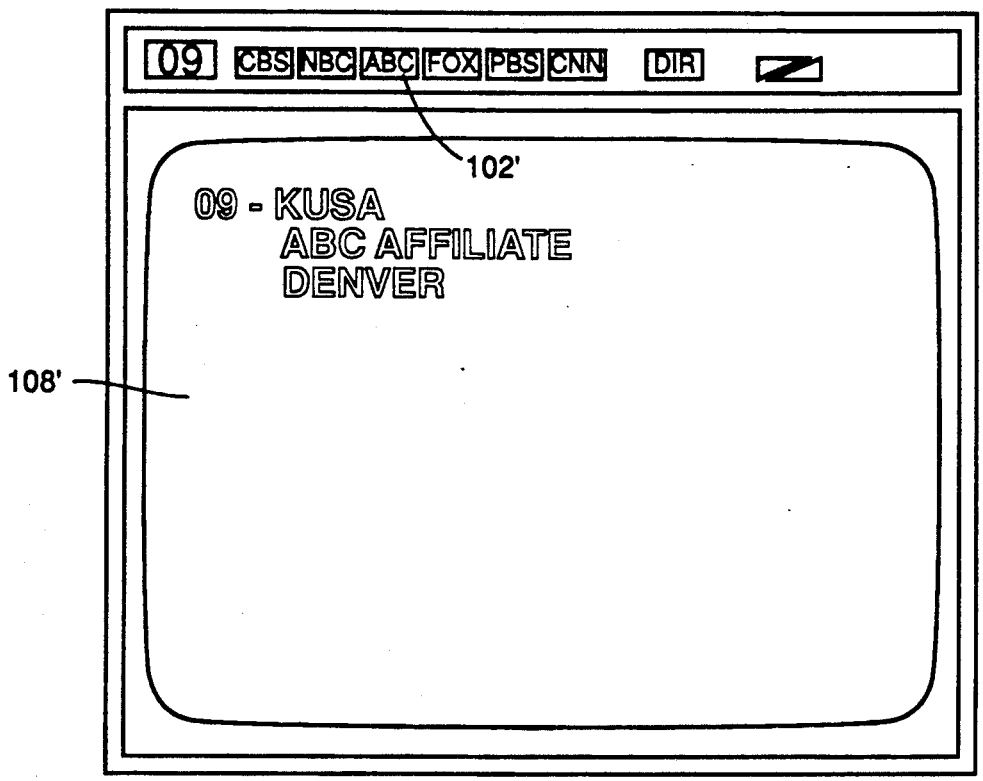
FIG. 17 is an illustration of the embodiment of the front of a television receiver showing automatic station identification and network affiliation that also illustrates the network affiliation attribute selection keys used for network scanning in television receiver applications.
Figure 18:
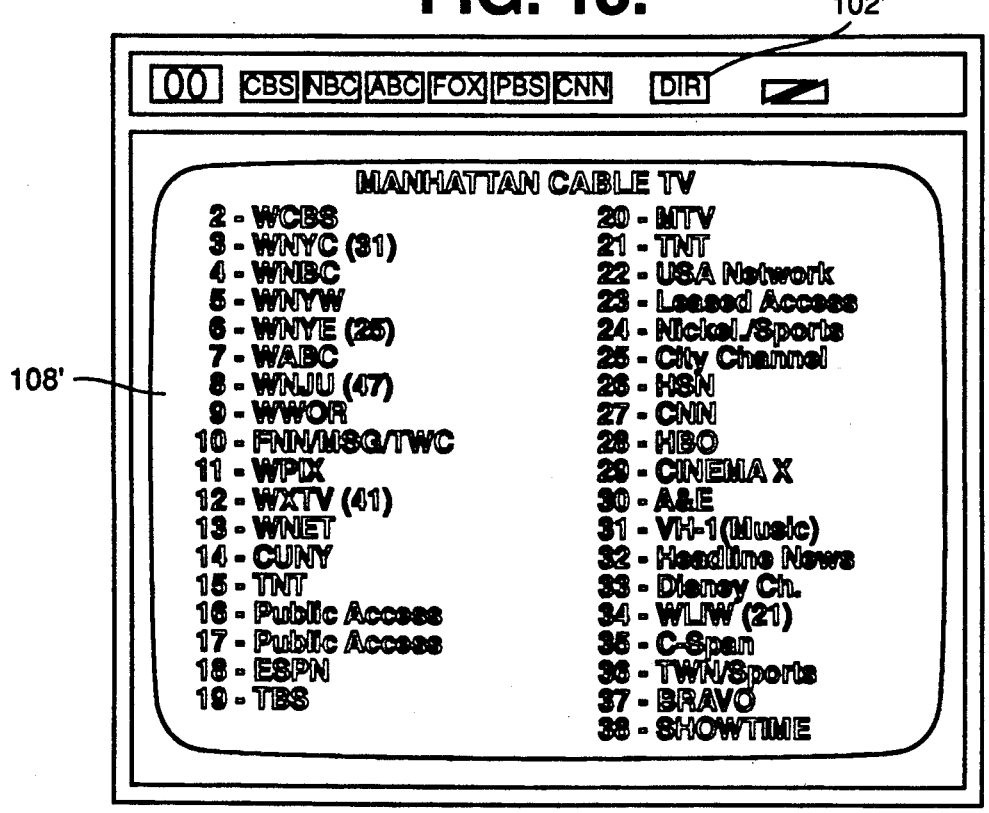
FIG. 18 is an illustration of an embodiment of the front of a TV receiver showing the directory listing capability particularly useful for cable television applications.

In TV receiver applications, the network affiliation information can be used instead of format information. FIGS. 17 and 18 illustrate an embodiment of the present invention as applied to television receivers.

Figure 4:
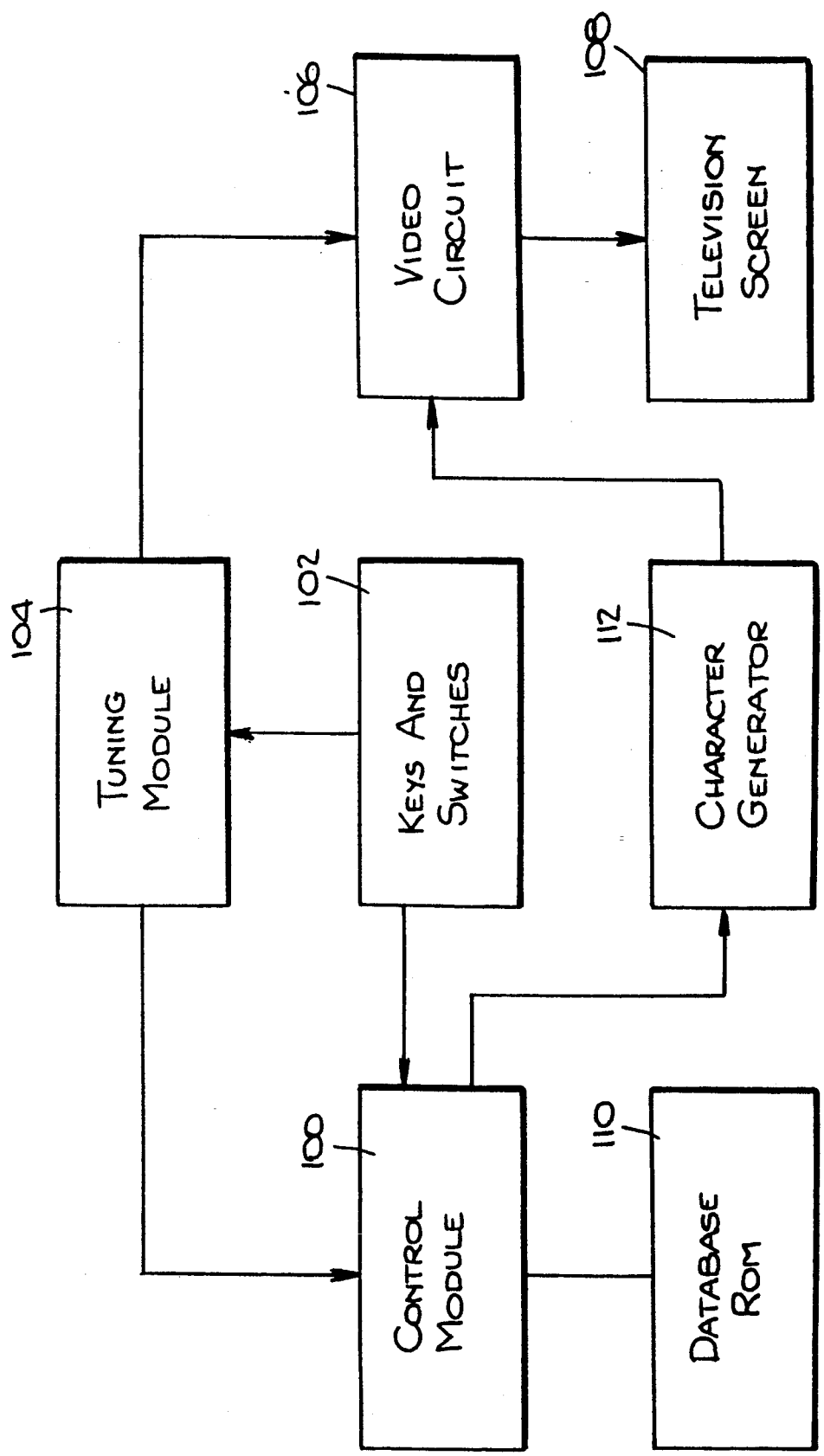
FIG. 4 is a block diagram illustration of an embodiment of the invention used in conjunction with a television receiver.

As may be seen in FIG. 4, the invention may be applied in a second embodiment for use in a television receiver. In this embodiment of the invention, a control module 100 receives inputs from keys and switches 102 as described above in connection with a receiver or tuning module 104 for selecting stations in a conventional video circuit 106 that are in turn, output to a television screen 108 in order to display the image being received. As before, database ROM 110 stores the information to be displayed about stations being received in this embodiment of the invention. The television screen 108 itself becomes the display and alpha-numeric characters are produced by a character generator 112 under the control of the control module and are supplied as input to the video circuit 106.

UPDATE RAM MEMORY

RAM (Random Access Memory) may be added to either broadcast receivers or frequency directories to allow the user to store update data which will take precedence over the corresponding ROM data, thereby eliminating the need to replace the ROM too often. Only a small number of bytes, 128 bytes for instance, is necessary to register the changes which will affect any one particular market of interest to the user. Changes such as formats and callsign changes can thus be registered by the user so as to keep the database updated over several years. A simple sequence of key presses is all that is necessary for the Module to store the new data in RAM. For example, should a station change its format from CLASSICAL to ROCK, all the user would need to do is to keep the ROCK key pressed for more than 2 seconds for the Module to register the new format in RAM together with the address of the old format so that the next time the Module accesses that information in ROM, a quick check of the RAM will provide the updated format. Other key combinations can likewise be used to register other changes such as frequency and callsign.

ATTRIBUTE SCANNING RECEIVER

As explained hereinbefore, broadcast stations have different formats. Thus, a given station, in the case of radio, will broadcast news, various types of music or be a "talk station". Listeners, of course, have equal numbers of varying tastes and more often than not want to tune to a station catering to their particular taste. This is also certainly the case when the user is in a location where he or she is not familiar with the formats of the stations capable of being received.

The use of a database that is prestored in a ROM 3 as explained hereinbefore greatly increases the utility of the broadcast receiver for listeners who may find themselves in an unfamiliar locale. This utility can be enhanced by including in the control module 1 and slave module 2 program a broadcast program format scan or other attribute select capability. This permits the receiver to not only conventionally scan a broadcast band for any available signal, but more importantly to select stations having a particular program format or another particular attribute. The prestored database therefore provides an accessible source of information for displaying certain attributes of a received station as explained hereinbefore, and furthermore is actively used to select only those radio stations having a desired attribute, such as format, language or network affiliation.

Figure 5:
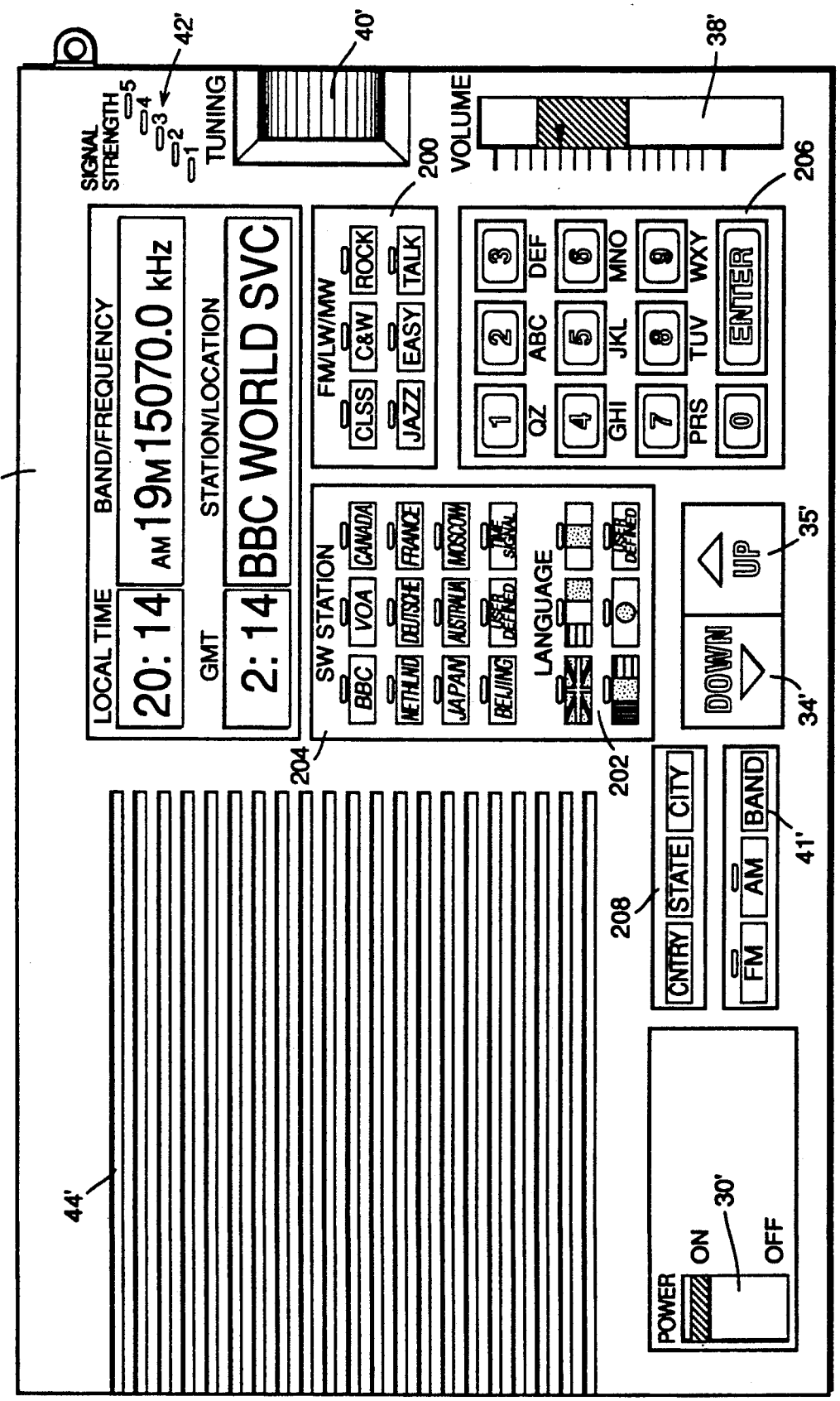
FIG. 5 is an illustration of an improved embodiment of the front of a receiver that can be used to practice the invention.
Figure 15:
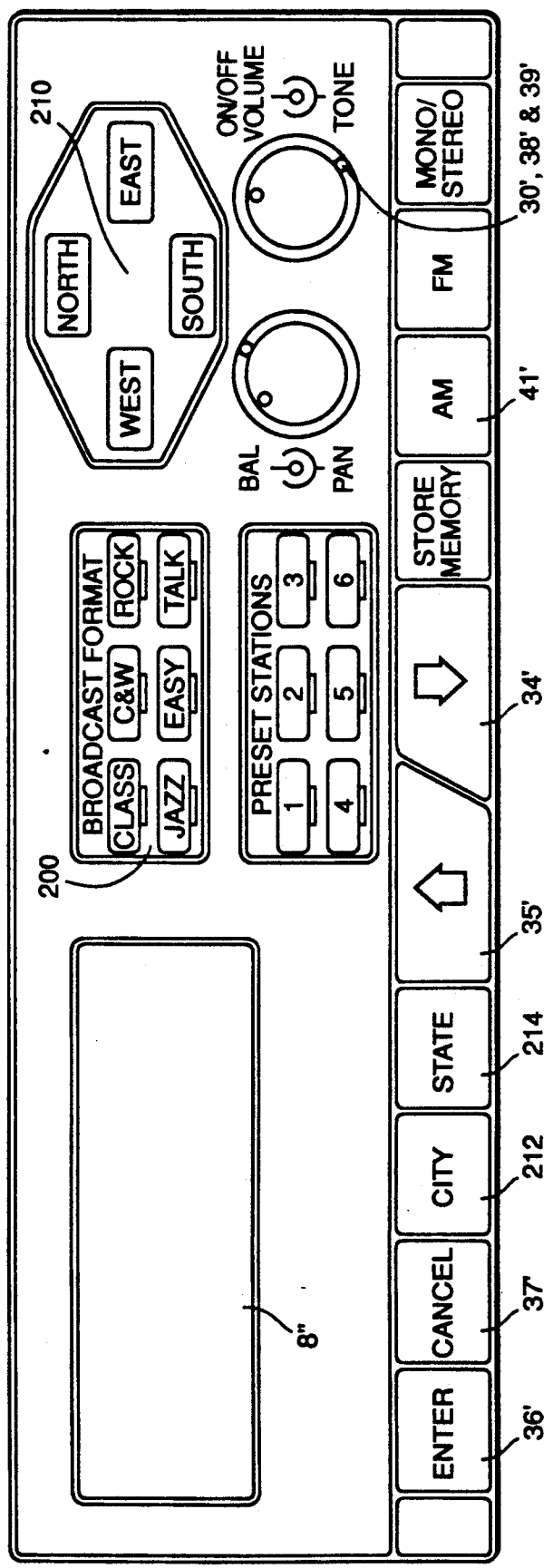
FIG. 15 is an illustration of an improved embodiment of the front of a receiver that can be used to practice the invention in an automotive environment.

In accordance with this improvement, FIGS. 5 and 15 illustrate the front of receivers incorporating the improvement as further embodiments of the present invention. FIG. 5, illustrates a portable radio receiver with station, format, and language scanning capabilities, while FIG. 15 illustrates a receiver for automotive use featuring format scanning capability and compass direction keys for receiver location update. Features which correspond substantially with the receiver illustrated in and explained with reference to FIGS. 2 and 3 are indicated by the same numeral with a prime (') or double prime (") suffix.

A display 8' (FIG. 5) and display 8" (FIG. 15) are provided which may conveniently convey the same type of information as the display shown in FIG. 3. However, in this case, all the information is not shown at once as on FIG. 3, but rather is cycled, item of information by item of information, on the display 8' or 8" whose space is more limited. The cycling may be automatic, for example, showing each item of information for two seconds each, without any intervention from the user, or, alternatively, the information may be cycled by the activation of a display switch, not illustrated, by the user, or a combination of both methods, manual and automatic, depending on the kind of information shown. Also the program format indicators have been augmented with a set of matching pushbutton input switches or keys 200. There is one switch provided for each type of program format stored in ROM 3. For example, in the current embodiments, the division of formats is in six classes, each represented by a format-select key, which may be as follows:

| | |
|---|---|
| CLASSICAL: | Classical music; Fine Arts; NPR news & Information programming |
| C & W: | Country music; Bluegrass; Folk Music |
| ROCK: | Top-40; Album rock; Classic rock; Progressive rock; Oldies |
| JAZZ: | Jazz; Rhythm & Blues; Urban contemporary |
| EASY: | Easy listening; Big Band; Beautiful Music; Popular music; Adult standards |
| TALK: | Talk; News; Business; Traffic; Comedy; Drama; Literature; Weather; Public Affairs |

Figure 8:
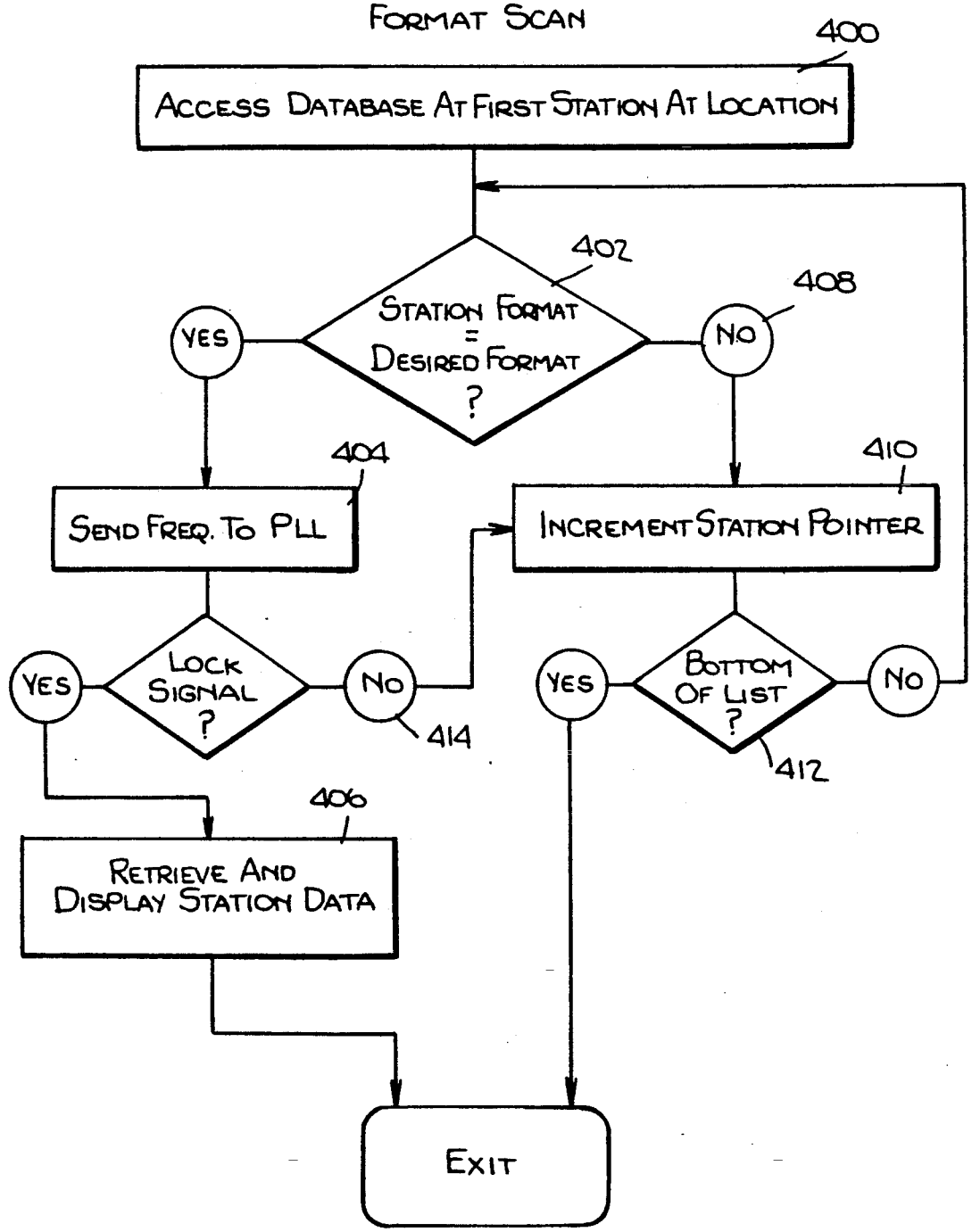
FIG. 8 is a flow diagram for an alternative program that scans the database prior to frequency selection.

Other classifications could, of course, be used to suit different groups of users. In particular, the resolution of the format breakdown could be higher so that a more detailed format classification could be offered by increasing both the number of labeled format keys on the unit and the number of format-labels on the display. In the embodiments shown in FIGS. 5 and 15, each format switch 200 is provided with individual lights in a known manner to indicate to the user when a particular switch is activated or when a station of a particular format is received, thereby eliminating the need for display segments dedicated to format indicators as shown in FIG. 8.

The receiver illustrated in FIG. 5 also includes language selection input switches 202 and station selection input switches 204 which when used singly permit the user to initiate search for a particular station, or for a particular language, or when used in pairs permit the user to initiate a search for a particular station broadcasting in a particular language. The latter function is particularly useful in shortwave receivers. In the embodiment shown in FIG. 5, switches 202 are labeled with various flags each indicating a particular language. These flags could, of course, be replaced with words or abbreviations to indicate the same language choice. Other station classifications or language classifications could, of course, be used to suit different groups of users.

Also included in the receiver in FIG. 5 is an alphanumeric input keypad 206 which may be used to input frequencies directly. Each numerical key is also labeled with part of the alphabet to allow input of a callsign or station name to permit the search of a station by callsign or station name. In this embodiment, the callsign search is initiated by pressing the ENTER key in pad 206 twice. Each letter of the callsign is then input by pressing the corresponding numerical key the appropriate number of times while a software controlled timer in the control module 1 keeps track of the duration of the pressure. For example, pressing the key labeled "5" once for a short time, less than one second for instance, and then pressing that key once more for more than one second would produce the letter "K" on the display 8' and so forth until the complete callsign is generated on the display 8'. At this point the user can press the ENTER key once more to start the search in the database stored in ROM 3. Keys 34' and 35' are used to move the cursor back and forth on the display 8' to allow editing of the callsign, if desired, before the search is initiated. The alphanumeric keypad 206 can, of course, be replaced with two dedicated keypads, one numeric and the other purely alphabetical.

The receiver illustrated in FIG. 5 also includes country, state and city input switches 208 while the receiver illustrated in FIG. 15 also includes city and state switches 212 and 214. These permit the user in combination with the up/down switches 34', 35' to program into the control module 1 the geographic location of the receiver. As explained hereinabove, this permits the control module 1 to access the correct portion of the database stored in ROM 3 that corresponds to the actual location of the receiver.

The receiver illustrated in FIG. 15 also includes compass direction input switches or key 210 which are used to update the location of the receiver as explained elsewhere herein.

The internal configuration and operation of the receivers are substantially the same as explained with reference to FIG. 1, with the addition, of course, that the keyboard input 7 now includes the individual format, language, station and alphanumeric input and selection buttons or keys 200, 202, 204, 206 and 208 (FIG. 5) and format, state, city and compass direction keys 200, 210, 212, and 214 (FIG. 15).

DATABASE ORGANIZATION

Figure 6:
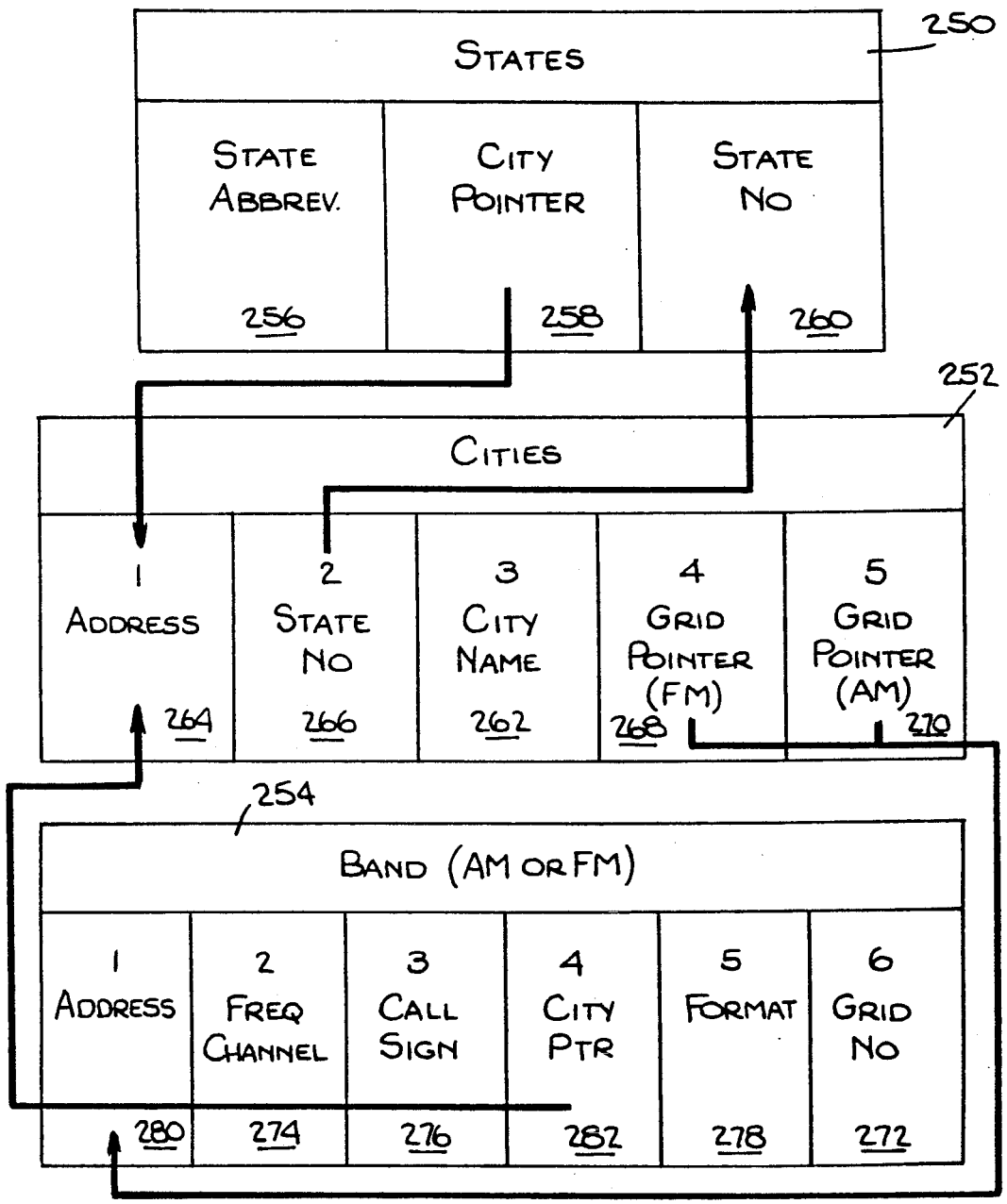
FIG. 6 is an example of a database organization for information stored in ROM relating to various attributes of available broadcast stations particularly useful for format scan.

In order to explain the format select/scan improvement, reference is now made to FIG. 6 which shows a typical database organization which may be used with the invention. It will be readily appreciated by those skilled in the art that the invention disclosed herein is not necessarily limited in all of its aspects to a particular type of database organization, the only requirement being that the display information for each available station be accessible by the control module 1 and slave module 2 as a function of geographic location as fully explained hereinbefore. The database organization of the preferred embodiments are, however, believed to be novel and nonobvious.

Accordingly, in the example shown in FIG. 6, the database is partitioned according to the three basic identifying criteria: 1) a STATES file 250; 2) a CITIES file 252; and 3) a broadcast BAND frequency file 254 based on geographical groupings called grids. Though, only one BAND is shown in FIG. 6, there may actually be separate BAND files for AM, FM, shortwave and so on.

Once a user has entered the city and state data for the location of the receiver, the control module 1 immediately can determine the available stations within the broadcast region. Accordingly, the STATES file 250 contains two data fields: 1) the "abbreviation" field 256 contains one two-letter record for each state covered in the database; 2) the "city pointer" field 258 contains a unique address for each state record that identifies the first city record for that state in the CTTIES file 252. The "state number" 260 is derived from the record position in the STATE file.

The CITIES file 252 contains four data fields: 1) a "city name" field 262 that contains an alphabetized record entry for each city covered in the database organized by state; 2) a "state number" field 266 that identifies the state each city is in; and 3) one or more grid pointers 268, 270 that identify for each city a unique address in the BAND file 254 for the first broadcast station in the corresponding geographic region where the receiver is located. Each record (consisting of the data in the four fields) is located at a unique address 264 in the CITIES file that indicates the position of the record in the file wherein the address of the first city for each state grouping (field 266) is the same as the corresponding city pointer 258 located in the STATES file 250.

The BAND file 254 contains all the available station entries covered in the database organized by geographic regions with each region assigned a unique grid number stored in field 272. The BAND file 254 also contains the attribute data for each station such as the "frequency" field 274, the "call letter" field 276, the "city pointer" field 282, and the "format" field 278. Each station of course has a unique address 280 wherein the address 280 for the first station in each grid region grouping (field 272) is the same as the corresponding grid pointer 268 or 270 located in the CITIES file.

As an example, and also referring to FIG. 15, suppose the user is located in Cleveland, Ohio. The user would first set the state by pressing the STATE switch 214 and by repeatedly pressing the up/down switches 35', 34' until the proper abbreviation "OH" would appear in the display. This combination of key strokes would make the control module 1 retrieve, in order, the state abbreviations located in field 256 of the STATES file 250, until the user presses the ENTER key 36'. At that point the control module 1 stores the state number 260 in memory.

The user would then set the city by pressing the CITY switch 212 and by repeatedly pressing the up/down switches 35', 34' until the proper city name "Cleveland" would appear in the display. This combination of key strokes would make the control module 1 retrieve the city names stored in alphabetical order and located in field 262 of the CITIES file 252, starting at the record pointed to by the city pointer 258 in the state file 250 which corresponds to the state number 260 previously stored in memory, the record corresponding to the first city in the state of Ohio, until the user presses the ENTER key 36'. At that point the control module 1 stores in memory the GRID pointers 268 and 270 for future use. The GRID pointer identifies to the control module 1 the first broadcast station in the geographic region that includes Cleveland, Ohio. The BAND file then is entered to locate by frequency match the station currently being received. Once a frequency match is made in the BAND file, all the other attribute data is retrieved from the corresponding records in the pertinent fields.

Whenever the receiver is tuned to a particular station and the control module 1 program is in the BAND file 254, the city pointer in field 282 provides an immediate cross-reference back to the CITIES file 252 so that the control module knows the city for the received station. Once back in the CITIES file the "state number" field 266 provides an immediate cross-reference back to the STATES file. This cross-reference between files is useful when the geographic grids include several cities so that even if the user initially programmed his location as Cleveland, if he is tuned to an Akron station the display 8' will convey "Akron, Ohio."

Format Scanning Operation

Figure 7:
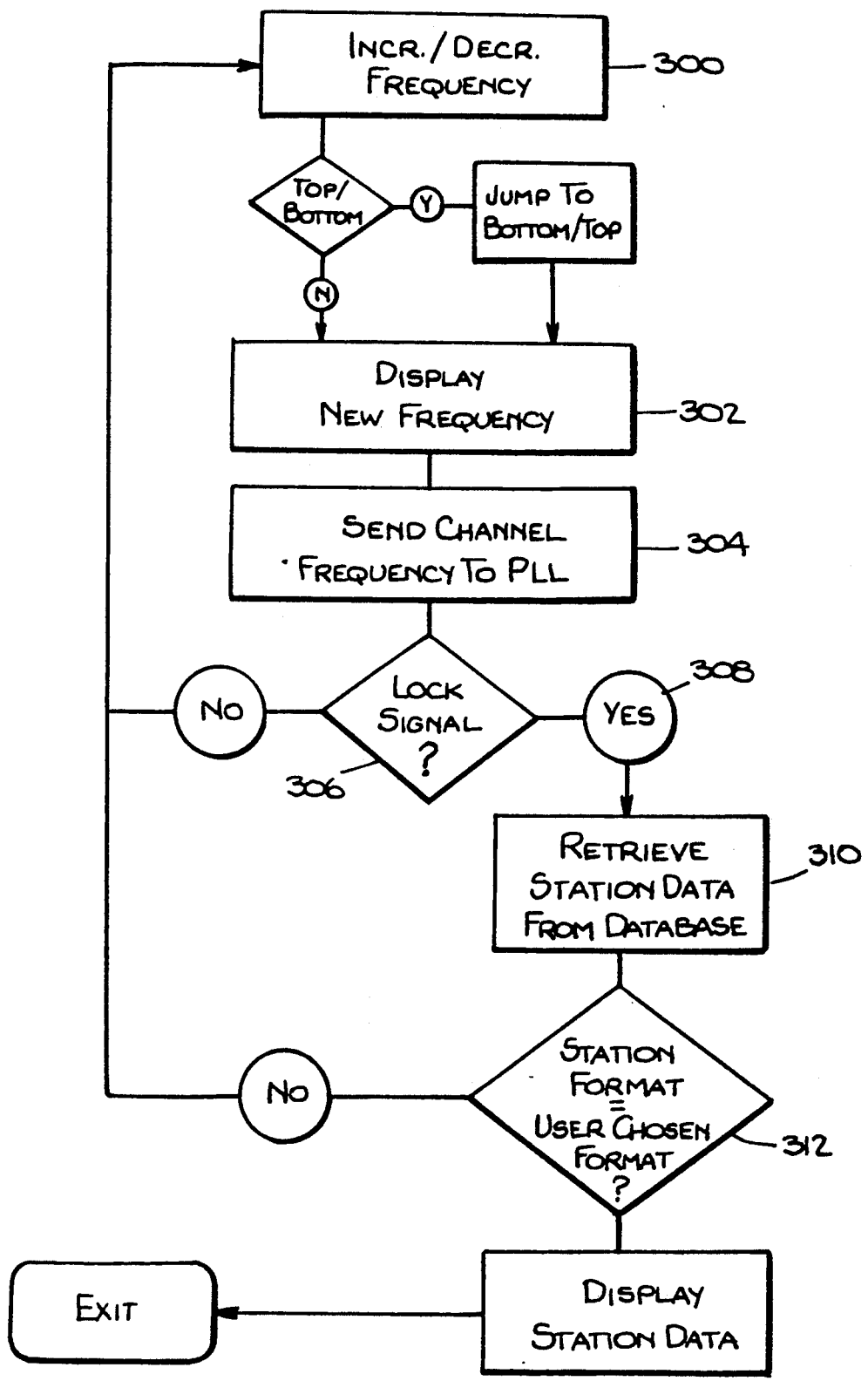
FIG. 7 is a flow diagram for a program that scans a database stored in the receiver of FIG. 5 to permit selective reception of available stations based on user preferred attributes such as station format.

With reference to FIG. 7, a format scan in accordance with the present invention is accomplished by first selecting a format. This is done by the user pressing one of the format keys 200. This initiates a frequency-scan at step 300 where the control module 1 increases the frequency, displays that frequency on display 8' at step 302, and sends that frequency to the PLL 5 at step 304.

At step 306 the control module checks whether a broadcast signal at the desired frequency has been received. If not, the receiver steps to the next frequency by looping back to step 300 as indicated.

Once a station has been locked into, as at step 308, the control module 1 at step 310 accesses the corresponding station information stored in ROM 3 based on the grid (geographic region) pointers, previously stored in memory during the state/city selection by the user.

Up to this point, operation of the receiver is substantially the same as fully explained hereinbefore. Whereas in the earlier embodiment, the receiver would next display the station attributes stored in memory, in this embodiment at step 312 the program checks whether the station format is the same as that selected by the user via switches 200. If yes, the control module 1 displays the station information on display 8' as previously explained herein.

If, however, the received station format is not the same as that selected by the user, the control module 1 program loops back to step 300 and begins searching for the next available frequency.

If no station with the desired format is found, the search is stopped when the search loops back to the frequency which was the current frequency at the time of the start of the search.

Alternative Format Scanning Operation

With reference to FIG. 8, in an alternative embodiment of the format select or scan feature, after the user has entered a desired listening format by pressing the appropriate format switch 200, the control module 1 program first accesses the database stored in ROM 3. The program goes to the first station record located in the BAND file 254 corresponding to the grid pointer previously stored in memory based on the city/state data. It will be recalled from the explanation of FIG. 6 that the available stations are organized by geographic location in the BAND file 254.

For example, suppose the user is in Cleveland, Ohio and desires an FM country and western station. The control module 1 accesses the first potentially available station data record that is in the geographic portion of the FM database that includes Cleveland.

At step 402 the program checks whether the format of the first potential station is the desired format. If yes, the receiver tunes to the corresponding frequency (step 404) and if the signal is received, then displays the station information on display 8' and permits reception (step 406).

If the format of the first station is not the desired format (step 408), or even if it is the desired format but the station cannot be received (step 414), the program jumps to the next station in the database for the geographic region (step 410) and loops back to step 402 to determine if the station is available and in the correct format. Step 412 shows that the program checks whether all potential stations in the geographic region have been scanned for format and availability. If all have been scanned and no stations are available the receiver simply tunes to the first available station, or can be programmed to scan adjoining geographic regions.

In the event that there are several stations available in the geographic region that have the desired format, if the user wants to try a different station having the selected format he can simply activate the appropriate format key again and the receiver will advance to the next available station having that format. If none is available, the receiver simply remains tuned at the current station.

It is possible that two or more stations may broadcast on the same frequency within the same general area, even having the same program format. Each time a station signal is received, the control module 1 program scans the database in ROM 3 based on the city/state and frequency data to determine all possible stations on that frequency within the listening area. Since the display 8' can only show one station at a time, the control module program alerts the user by sounding a buzzer (not shown) twice and permitting the user to alternately view the station data for each station on the tuned frequency by pressing the ENTER key 36'.

Each time the ENTER key is pressed the control module 1 displays the data for the next station on the same frequency within the general listening area. By repeatedly activating the ENTER key the user can cycle through all the possible candidates for the station actually being heard. This feature is particularly useful in shortwave radio applications.

Language Scanning

The present system can also be used to scan for frequencies of stations that broadcast in a user selected language, instead of by program format. Language scanning is especially helpful on the shortwave band, where there are many international broadcasts in different languages. The type of language spoken on a particular broadcast frequency can be stored in place of or in addition to the "format" field 278 in BAND file 254. The user can select the desired language by pressing language keys on the face of the radio similar to the format keys 200, discussed above. Pressing one of these keys would initiate a frequency-scan like the format scan shown in FIG. 7, but at step 312 the station language would be compared to the language selected by the user in place of format.

ALTERNATIVE DATABASE ORGANIZATION

Figure 9:
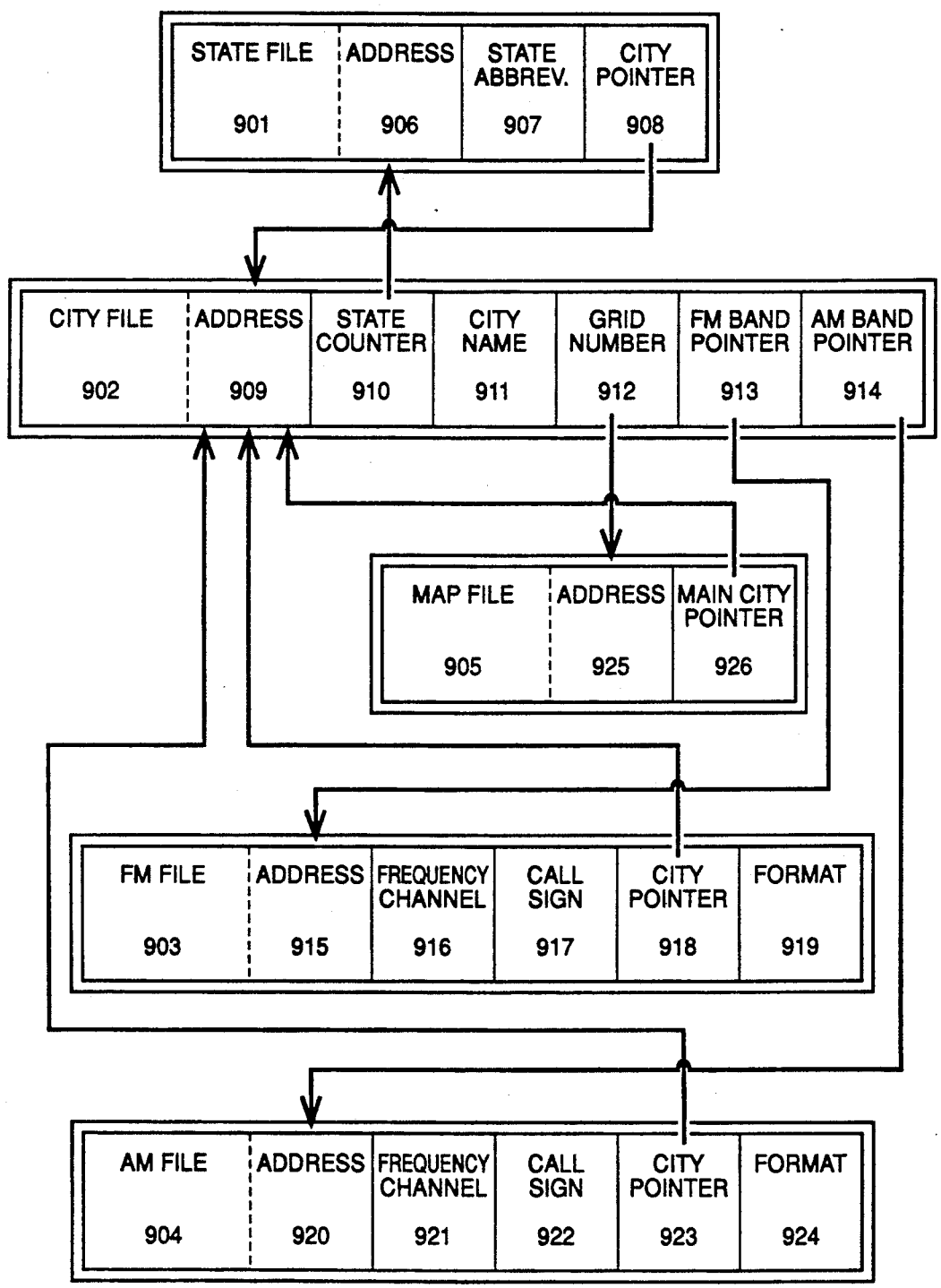
FIG. 9 is another example of a database organization for information stored in ROM relating to various attributes of available broadcast stations particularly useful for format scanning, manual or automatic location updating, and spiral searching.

In FIG. 9, an alternative database organization of another embodiment of the invention is depicted. The database is essentially partitioned like the database shown in FIG. 6 and includes: STATE file 901; CITY file 902; FM file 903; AM file 904; and MAP file 905.

STATE file 901 contains a list of all of the states covered by the database, and is comprised of two data fields and an ADDRESS 906 identifies a particular state and is used for cross-referencing between files. STATE ABBREVIATION 907 represents a two-letter acronym for the state addressed by ADDRESS 906; and CITY POINTER 908 represents the first city listed for the addressed state.

CITY file 902 contains a list of all of the cities in the database, both cities in which the user is located and traveling to. The CITY file 902 includes five data fields and on ADDRESS 909 identifies a location in the database of a CITY record that can be addressed, for example, by the CITY POINTER 908 in the STATE file 901. STATE COUNTER 910 indicates the state in which the city addressed by ADDRESS 909 is located; CITY NAME 911 represents an eight-letter acronym for the addressed city; GRID NUMBER 912 indicates the grid (geographical region) in which the addressed city is located; FM BAND POINTER 913 identifies the first FM radio station listed for the addressed grid; and AM BAND POINTER 914 identifies the first AM radio station listed for the addressed grid.

FIG. 9 shows an FM file 903 and AM file 904, each of these BAND files list all of the broadcast stations for a particular band, i.e., FM, AM, shortwave, HF, VHF, UHF, etc., for the grids listed in the MAP file 905. There are as many BAND files as there are bands that can be received by the receiver. The FM file 903 and AM file 904 contain four fields and an ADDRESS 915, 920 which identifies a location in the database of a FM and AM record, respectively. FREQUENCY CHANNEL 916, 921 represents the frequency of a radio station stored in the FM and AM records addressed by ADDRESS 915, 920, respectively; CALL SIGN 917, 922 represents the call sign for the addressed radio station; CITY POINTER 918, 923 identifies the city in which the addressed radio station is located; and FORMAT 919, 924 consists of two values. As shown in FIG. 10, the most significant value 1001 of FORMAT 919 or 924 represents the program format for the addressed radio station, and the least significant value 1002 indicates whether the addressed station is the last station listed in the BAND file for a particular grid. Marking the last station for each grid permits the BAND files to efficiently store the station information without wasting memory space.

MAP file 905 is comprised of a list of pointers to the most populated city (if any) in each grid. The MAP file 905 contains one data field and an ADDRESS 925 which identifies a location in the MAP file 905. The MAIN CITY POINTER 926 identifies the main city in the grid record addressed by ADDRESS 925.

Grid Numbering

As discussed above, the database is organized in geographic regions with each region being assigned a unique grid number. For example, FIG. 11 shows an exemplary grid map for the United States having a matrix of grids numbered from 1 in the lower-right corner to 1450 in the upper-left corner, wherein the grid numbers increase from East to West and South to North. The resolution of the grid is chosen so that it at matches the average area of coverage of the broadcast transmitters. For example, a grid resolution of 1 degree latitude by 1 degree longitude, at 40 degrees North and 75 degrees West, would create a grid of rectangles of approximately 69 miles by 53 miles.

Figures 12, 13:
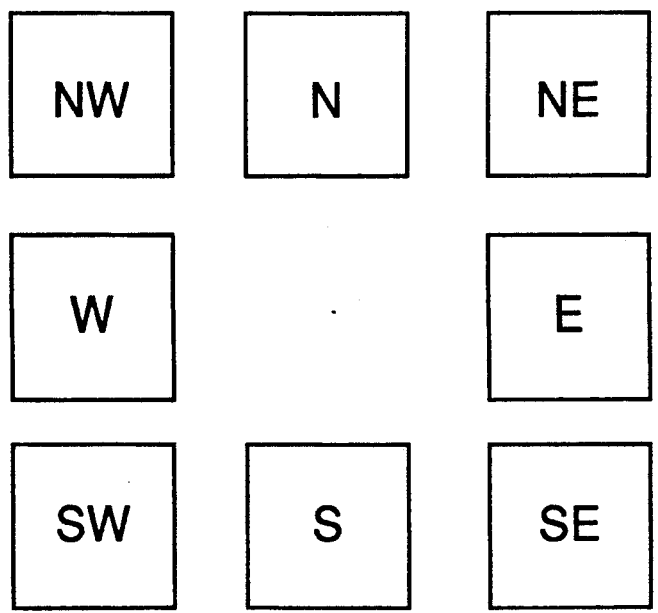
FIG. 12 is a layout of grids in the vicinity of a central current grid P.
FIG. 13 is a diagram showing a layout of direction keys for indicating the direction of movement.

FIG. 12 is a diagram showing a sub-matrix of grids in the vicinity of a central grid P, wherein central grid P represents the grid in which the broadcast receiver is located and is assigned grid number P. Each of the grids adjacent to central grid P are labeled with letters corresponding to the directions of a compass, i.e., N, NE, E, SE, S, SW, W and NW.

When the broadcast receiver is mobile, travelling from one grid to another, it is necessary to update grid number P so that FM and AM files 903, 904 for the new geographical region can be accessed by the receiver. In order to perform this operation, latitude increment L in FIG. 11 is set equal to the grid number of the lower-left grid, e.g., 58, which represents the number of grids in each row of the grid matrix, and high grid H is set equal to the grid number of the upper-left grid, e.g., 1450.

Latitude increment L is added or subtracted from grid number P to determine the grid number of the grid being entered by the broadcast receiver when moving north or south, respectively. More specifically, when the receiver is moving from the central grid P to grid N, new grid number P is determined using the equation $P=P+L$, and when moving to grid S by $P=P-L$. Grid number P for the each of the grids adjacent to the central grid P are calculated by control module 1 using the following equations:

North: $P = P + L$

North-East: $P = P + L - 1$

East: $P = P - 1$

South-East: $P = P - L - 1$

South: $P = P - L$

South-West: $P = P - L + 1$

West: $P = P + 1$

North-West: $P = P + L + 1$

Since the grid matrix shown in FIG. 11 has boundaries to the north, south, east and west, prior to updating grid number P a test is performed to determine whether the central grid P is on the border of the grid matrix. It is necessary to identify the border grids in order to avoid "wrap-around", for example, moving from California West to New Jersey. The "wrap-around" test will be described below.

Semi-automatic Location Determination

The original location, i.e., city and state, of the broadcast receiver is initially input by the user using the function keys to scroll through the alphabetical list of states and cities and choose the current location, as described above. When this is completed control module 1 stores as Grid Number (P) the value read from the GRID NUMBER field 912 of the CITY file 902 for the current city. The user can also use the above-described operation to update the location of the broadcast receiver, which may be practical if the move is permanent or semi-permanent. However, this operation may be difficult to perform while driving a vehicle.

To simplify the process of updating the location of the broadcast receiver, direction keys can be provided on the face of the receiver. For example, as shown in FIG. 15, four keys 210 can be provided to permit the user to indicate whether the receiver is entering a grid to the North (N), South (S), East (E) or West (W) of the current grid (P). Alternatively, four additional keys could be provided to select Northeast (NE), Southeast (SE), Southwest (SW) or Northwest (NW) as illustrated in FIG. 13. Of course, if only four keys 210 are provided as in FIG. 15, all the eight cardinal points can still be inputted by pressing a single key for the main quadrants, such as N or E or S or W, and by pressing two keys in succession such as N and E; or N and W; or S and E; or S and W for the remaining four intermediate points.

If the user is moving North he would merely press the N key once. Upon activation, control module 1 would calculate its new location (P) using the formula If $P <= H-L$ then $P=P+L$ As shown in FIG. 11, L=number of grids in each row of the grid matrix, and H=maximum number of grids in the grid matrix. The IF clause is a test to determine whether the current grid is at the edge of the grid matrix, in order to prevent "wrap-around" to the other side of the grid matrix, as discussed above.

The control module 1 uses the new P value to address MAP file 905 to retrieve the MAIN CITY POINTER 926, which is used to address ADDRESS 909 of CITY file 902 for the largest city in new Grid Number P. As described above, the STATE COUNTER 910 in CITY file 902 is then used to retrieve the STATE ABBREVIATION 907 from STATE file 901 addressed by the STATE COUNTER 910. After retrieving the location information, control module 1 displays on display 8 the name of the major city and the state for the new grid.

Similar operations could be performed by the user when travelling into any of the other adjacent grids. The "wrap-around" tests and formulas for each of the adjacent Grids are set forth below.

---

North:
If $P <= H - L$
then $P = P + L$
North-East:
If $P <= H - L$ and $((P-1)/L) - INT((P-1)/L) <> 0$
then $P = P + L - 1$
East:
If $((P-1)/L) - INT((P-1)/L) <> 0$
then $P = P - 1$
South East:
If $P > L$ and $((P-1)/L) - INT((P-1)/L) <> 0$
then $P = P - L - 1$
South:
If $P > L$
then $P = P - L$
South-West:
If $P > L$ and $(P/L) - INT(P/L) <> 0$
then $P = P - L + 1$
West:
If $(P/L) - INT(P/L) <> 0$
then $P = P + 1$
North-West:
If $P >= H - L$ and $(P/L) - INT(P/L) <> 0$
then $P = P + L + 1$

---

An alternative to performing the "wrap-around" tests listed above is to include data in the MAP file to indicate grid matrix boundaries.

Automatic Location Determination

To avoid having the user press the direction key (N/S/E/W) while travelling, a "navigation system" can be added to the receiver to permit the control module 1 to update its location automatically as the vehicle travels from one grid to another. For example, an inexpensive "navigation system" would consist of an electronic compass, i.e., magnetic flux sensing type adjusted for the vehicle magnetic idiosyncrasies, and an interface with the vehicle odometer.

However, merely using a compass may be inaccurate because of local magnetic variations. Local magnetic variations are due to the differences between "True North" (as shown on maps) and the "Magnetic North" at any given location, and are significant over most of the globe (as can be seen on any sectional map used by pilots). For example, in New York City, the variation is +12 degrees.

Idiosyncratic magnetic variations, on the other hand, are due to fields generated by the vehicle itself, and can be determined and compensated for once, upon installation of the unit, by taking compass readings while facing the car in four or more compass directions.

Compensating for local variations is more difficult since it changes at every location and over time as "Magnetic North" travels (only appreciably over decades). Therefore, compensation data relating to local variations needs to be stored in the database, for example, in an additional field in MAP file 905. If the additional field is four bits in length an absolute variation from 0 to 16 degrees can be performed, and if the field is eight bits in length an absolute variation from 0 to 256 degrees is possible.

In addition, since the East-West width of each grid is a function of its latitude, it is necessary to know the latitude for the current grid in order to determine the grid's width in miles or kilometers. The current latitude can be calculated from the current grid number (P) using the following formula Current Latitude=Lat(0)+INT((P-1)/L)

Where Lat(0) is the latitude in degrees of grid number 1, the origin of the grid matrix, and is stored in the database for retrieval by control module 1.

Figure 14:
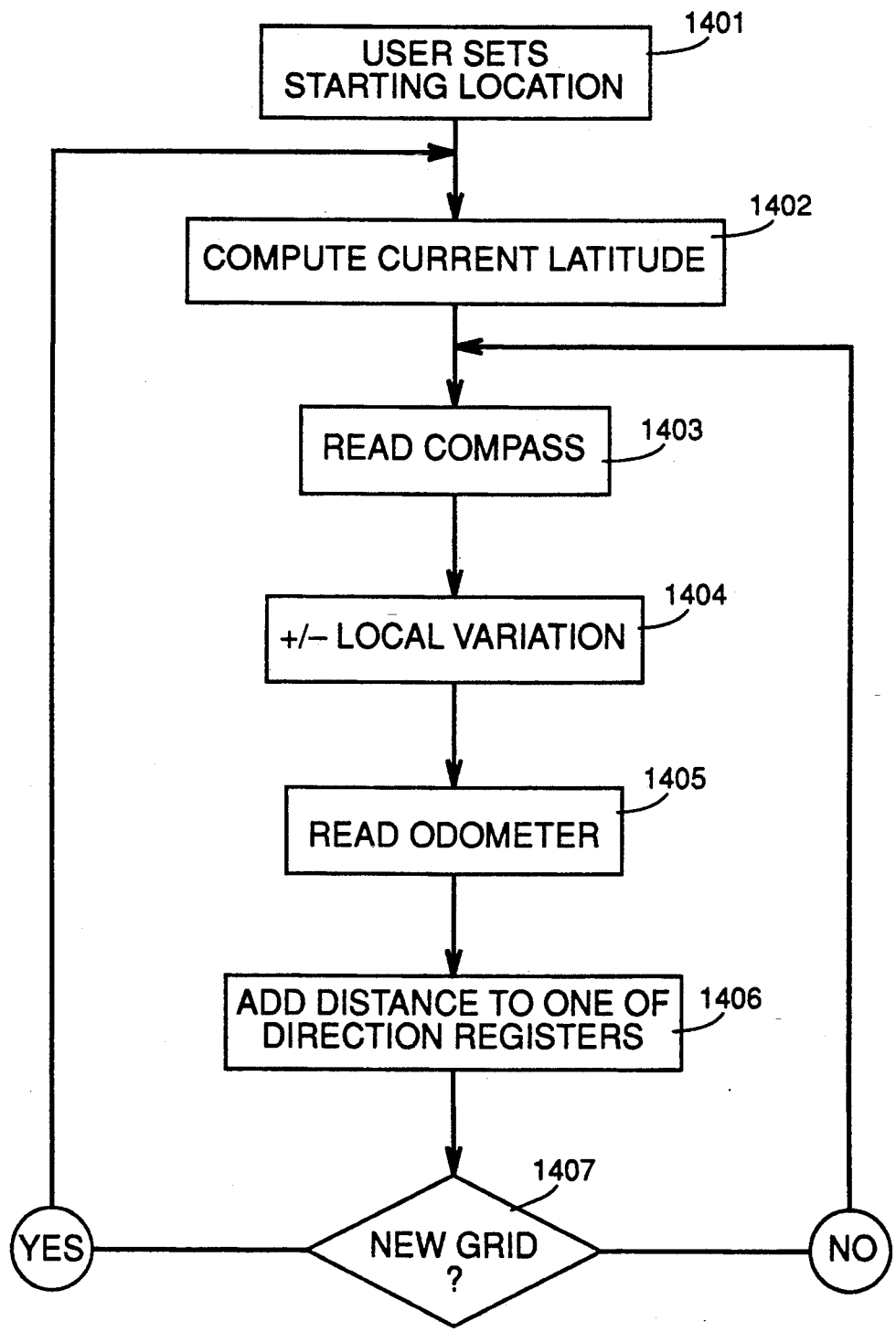
FIG. 14 is a flow diagram showing a procedure to automatically update the location of the receiver as the receiver moves from one grid to another.

FIG. 14 is a flowchart showing the operation performed by control module 1 to update the receiver's current location. In step 1401 a user sets the starting location by inputting the state and city in which the broadcast receiver is located, i.e., the original grid number (P). The control module 1 then computes the current latitude using the current grid number (P) in step 1402. The compass is read by the control module 1 in step 1403, in step 1404 the +/− local variation is read from the database, and the odometer is read in step 1405. This information is then used to calculate the direction and distance of movement since the last measurement in step 1406. At step 1407, control module 1 based on the movement calculated in step 1406 determines whether a new grid has been entered. If the answer in step 1407 is NO the process branches back to step 1403 to again read the compass, and if the answer is YES the current latitude is updated based on the new grid location.

To provide greater resolution in each grid than that provided by the grids described above, each grid can be subdivided into "mini-grids". For example, the grids shown in the grid matrix in FIG. 11 have a resolution of one degree (approx. 60 miles/side), but if four additional bits (one nibble) were provided to designate each grid there would be 16 "mini-grids" within each grid (4×4, 15 miles/side) and if eight bits (one byte) were provided there would be 256 "mini-grids" within each grid (16×16, approx. 3.75 miles/side). By providing greater resolution the receiver would be capable of limiting its search to broadcast frequencies within a more local area.

SPIRAL SEARCHING FEATURE

Another feature of the present invention is directed to providing a receiver with the capability of expanding its search of the data base for broadcast stations that are the most likely to be received by the receiver at a particular geographic location or grid. If the receiver does not find a desired broadcast station in the immediate grid or geographical region, the receiver is capable of performing what is called a "spiral-search" routine. The "spiral-search" routine involves sequentially searching for the desired broadcast station in the grids that are adjacent to and surrounding the immediate grid. The length of the radius can be controlled by the user through a "LOCAL/DX" switch on keyboard 7 or automatically by control module 1, depending upon the selected band, time of day (wider at night in the AM band), location near a mountain (restricting FM coverage), etc. These special situations can be sensed by the CPU 2 looking for flags that are pre-stored in the database, by the time of day clock, or by determining the current band in use (e.g., short search in FM, wide search in shortwave).

In addition, after a desired broadcast station has been found the direction from which the broadcast is coming can be displayed on the receiver. Since the database in the receiver stores the grid number for the grid in which the broadcast station is located, a compass direction to the broadcast station relative to the current location can be determined by control module 1. The compass direction can then be displayed using compass points on the display or indicator lights associated with each of the compass point keys 210, shown in FIGS. 13 and 15. For example, if a broadcast was coming from the North-East, both the N and E keys would light thereby indicating the direction of the broadcast station.

The "spiral search", unless restricted by a direction factor or the "wrap-around" test mentioned above, is symmetrical. For example, a short search outside the current position P might include a single grid in each direction and a long distance search would cover two or more grids in all directions.

BROADCAST FREQUENCY DIRECTORY SYSTEM

Figure 16:
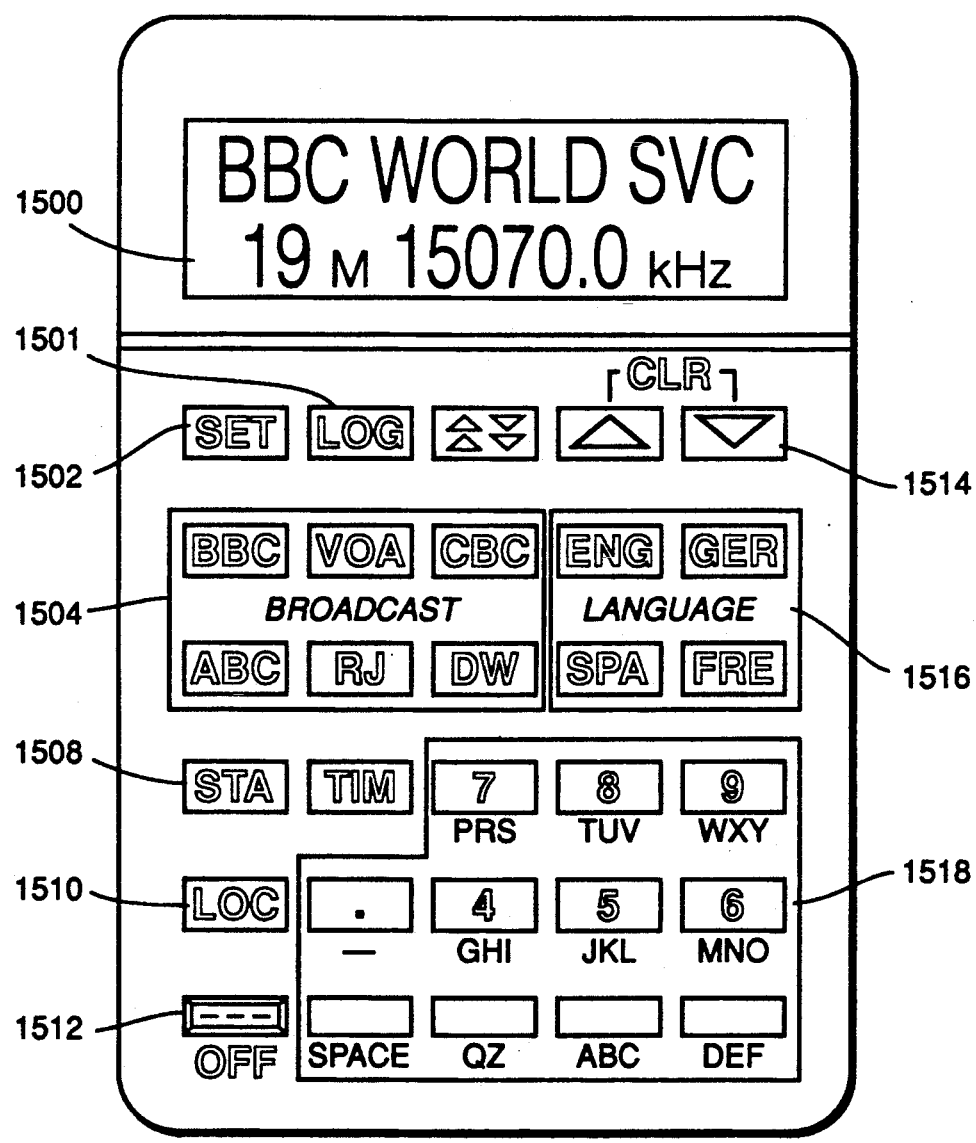
FIG. 16 is an illustration of the embodiment of a frequency directory which may be used to practice the invention without a receiver.

In the forgoing discussion, it is to be understood that the above-described embodiments are merely illustrative of the present invention. Other suitable variations and modifications could be made to these embodiments, and still remain within the spirit and scope of the present invention. For example, the present invention, as used in the scanning broadcast receiver described above, can also be used in a broadcast frequency directory system as illustrated in FIG. 16. A broadcast frequency directory system would include all of the features of the scanning broadcast receiver, but would not include a receiver or tuner. The directory system would therefore be capable of retrieving and displaying information relating to broadcast stations in a user selected geographical location based on a desired program format, type of language spoken, etc. input by the user. In addition, such a directory system could be made small enough to be hand-held and easily carried by the user.

FIG. 16 shows an embodiment of a hand-held directory system according to the present invention. A display 1500 is provided which may conveniently convey the same type of information as the display 8' shown in FIG. 5. A switch 1508 labeled "STA" is provided to initiate callsign or station name entry via the alphanumeric keypad 1518 as explained in the description of FIG. 5. The switch 1502 labeled "SET" is provided to permit the user in combination with the key 1510 labeled "LOC" and the up/down keys 1514 to program into the control module 1 the geographic location of the directory system. Switch 1510 labeled "LOC" may also be used singly to redisplay the current programmed location on display 1500. Toggle switch 1512 is provided to turn the system on or off. A set of switches 1504 and 1516 permit the same function of station and language selection as described for switch banks 202 and 204 (FIG. 5). If desired, format selection switches 200 (FIG. 5) may be added to the system or may replace the switch banks 1504 and 1516 to suit a different group of users. An additional input switch 1501 labeled "LOG" is provided to earmark a particular frequency that the user may want to recall later on a priority basis. This function is particularly useful in shortwave application where stations are usually transmitting on several frequencies simultaneously but with unequal reception quality. This switch would permit programming of the control module with a flag or counter for one frequency from each set of frequencies for each station or station/language combination in case one particular frequency was better received than the others in the same set and that the user wanted to later recall with ease that one particular station or station/language combination.

RADIO RECEIVER WITH UPDATABLE DATABASE

Figure 20:
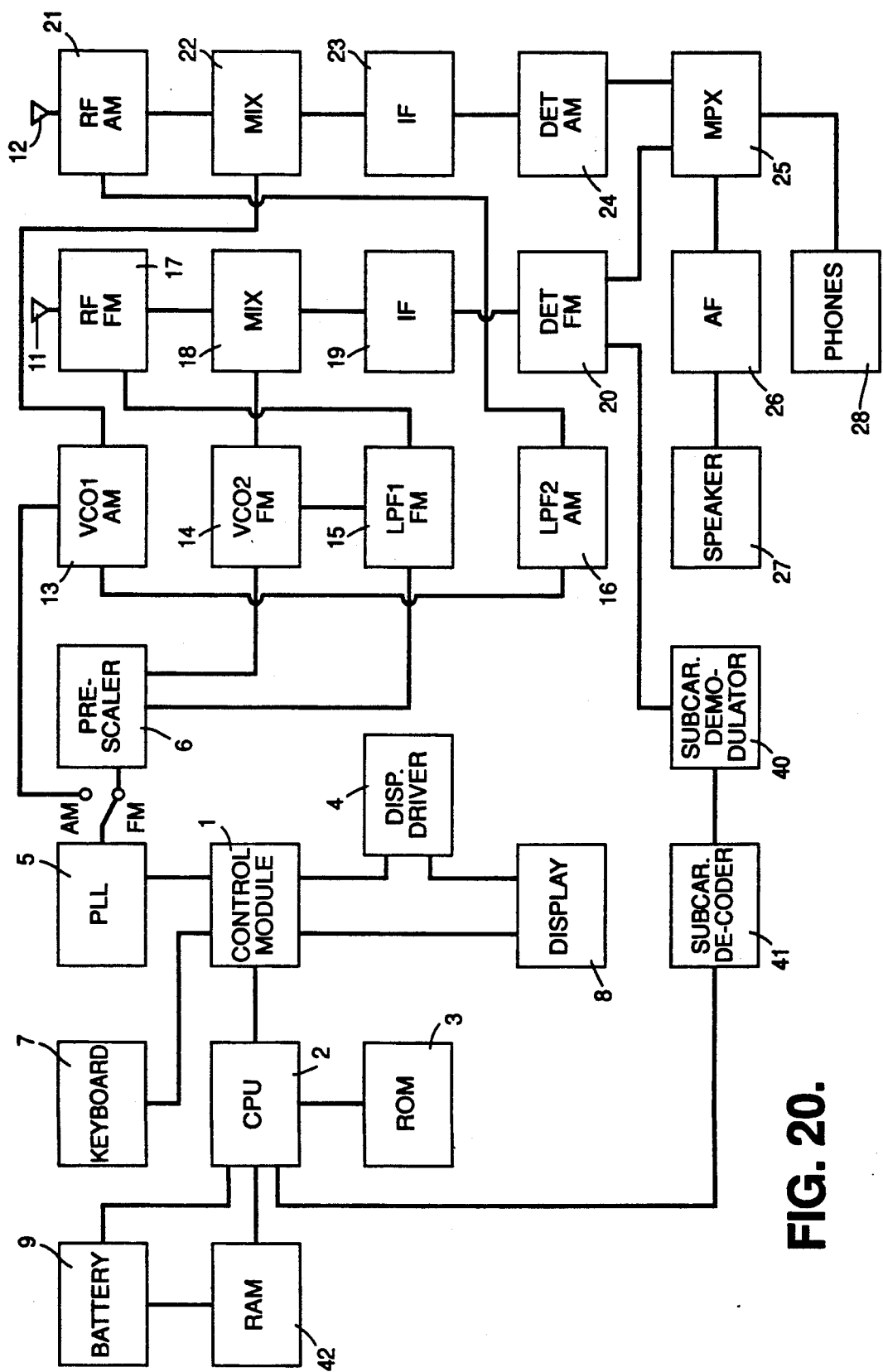
FIG. 20 is a block diagram illustrating a radio receiver in accordance with the invention.

Referring now to FIG. 20 of the drawings, a radio receiver in accordance with the invention includes all the parts described in FIG. 1 with the addition of three highlighted blocks: a memory means 42, here described as RAM (Random Access Memory) which is linked to the CPU 2 and which is the memory means in which updated data is stored and retrieved by CPU 2. RAM 42 is also linked to battery 9 to provided a continuous power supply to ensure data conservation if memory means 42 is of the volatile type.

Also added are the subcarrier demodulator 40 and the subcarrier decoder 41. The demodulator 40 receives its input from the FM detector 20. This signal is the same as the multiplex 25 signal input. The output of demodulator 40 is then fed to the decoder 41 which retrieves the digital signal from the VHF/FM subcarrier that has been encoded in the subcarrier at the transmitter site.

The output of decoder 41 is input to the CPU 2 for storage in memory means 42.

Figure 22:
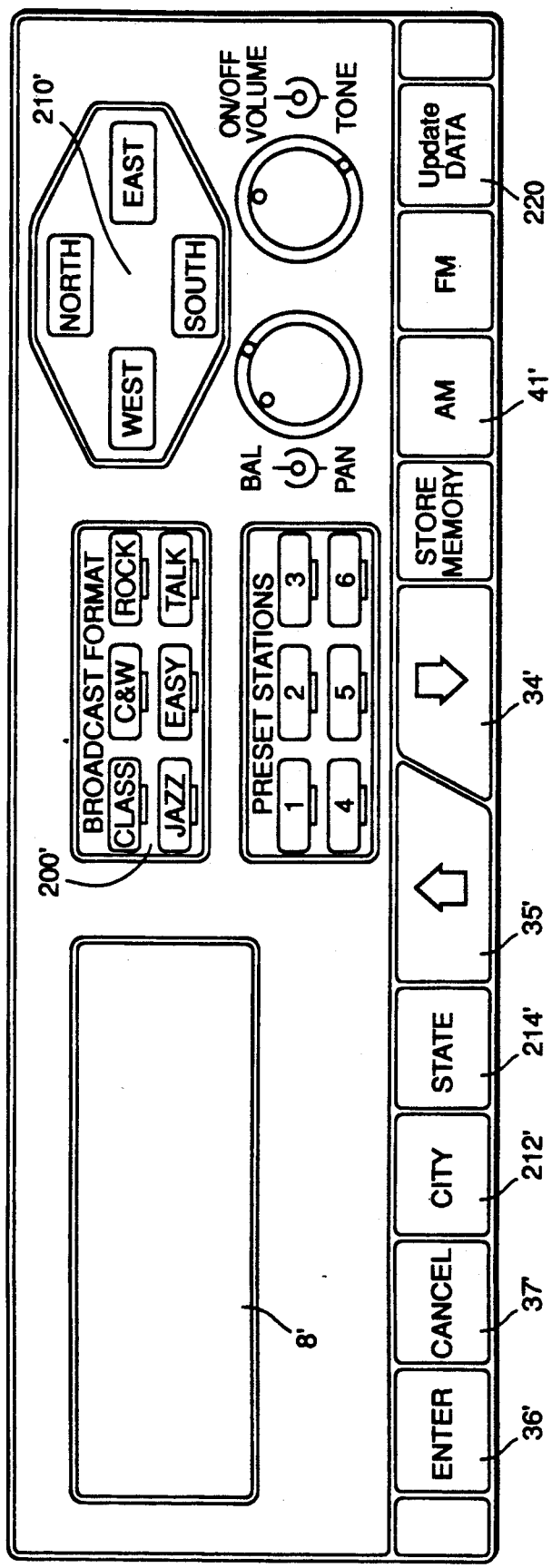
FIG. 22 is an illustration of an embodiment of the front of a receiver which can be used to practice the invention in the user-prompted mode.

FIG. 22 illustrates an embodiment of the front of a receiver that can be used to practice the invention. All features and numbering are similar to FIG. 15 where they are described in detail, except for key 220 labeled "Update DATA". This key is made available to the user to allow a user-prompted data update. This key can be used to tell the receiver to tune to a subcarrier-capable FM station that transmits the encoded update data in its current market. This is only one of several methods that can be used to tell the receiver when to tune to such a station for reception, decoding and storage of the update data stream. Other methods are described fully later in this disclosure where user-prompting is not necessary and where the data update is done automatically and transparently.

UPDATE DATABASE ORGANIZATION

Figure 21:
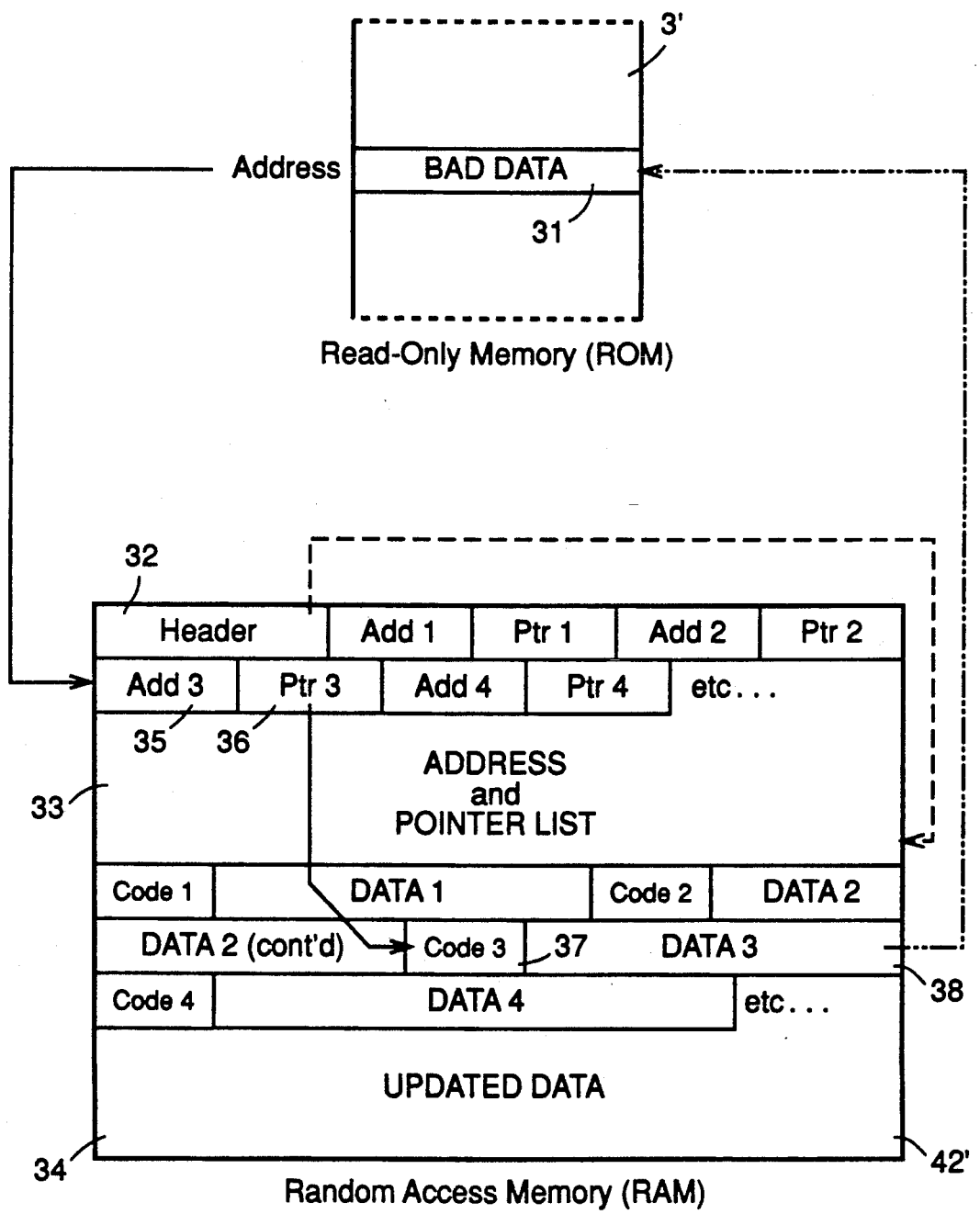
FIG. 21 is a diagram illustrating an example of an organization of updated data and its relation to the superseded data it replaces.

FIG. 21 describes an organization of the data in memory means 42 of FIG. 20 (here assigned the number 42') and its relationship to the data in memory means 3 of FIG. 20 (here assigned the number 3'). It is assumed that memory means 3' is of the read-only (ROM) L. type and that memory means 42' is of the volatile read/write type (RAM), although both memory means could be of the read/write type.

Assuming that data contents 31 of the ROM 3' has been superseded, then the address of that superseded data is stored in a list of superseded addresses 33. A header 32 is stored in the first few bytes of RAM 42'. This header contains the address of the last address-pointer pair in the list of superseded addresses 33. This address is used by processor 2 of FIG. 20 when it is scanning for superseded addresses. Each address-pointer pair in list 33 is illustrated by the Add3-Ptr3 pair 35 and 36. Each address 35 is the actual address of a superseded record in ROM 3'. Each pointer 36 points to an address in the updated data area 34 of RAM 42'. For example, pointer 36 points to the code byte 37 which is followed by the corresponding updated data 38. Code byte 37 is described in detail in FIG. 24, the code byte indicates to processor 2 in FIG. 20 the actual nature of the superseded data, its length and its relationship to the original record. Immediately following code byte 37 is the updated data 38 which contains the bytes that processor 2 in FIG. 30 will use instead of the original data bytes in record 31 in ROM 3', Note that since code byte 37 is present, only the actual superseded data bytes need to be stored in RAM 42'. In other words, the whole record 31 need not be duplicated in RAM 42', only the byte or bytes that need updating.

Figure 23:
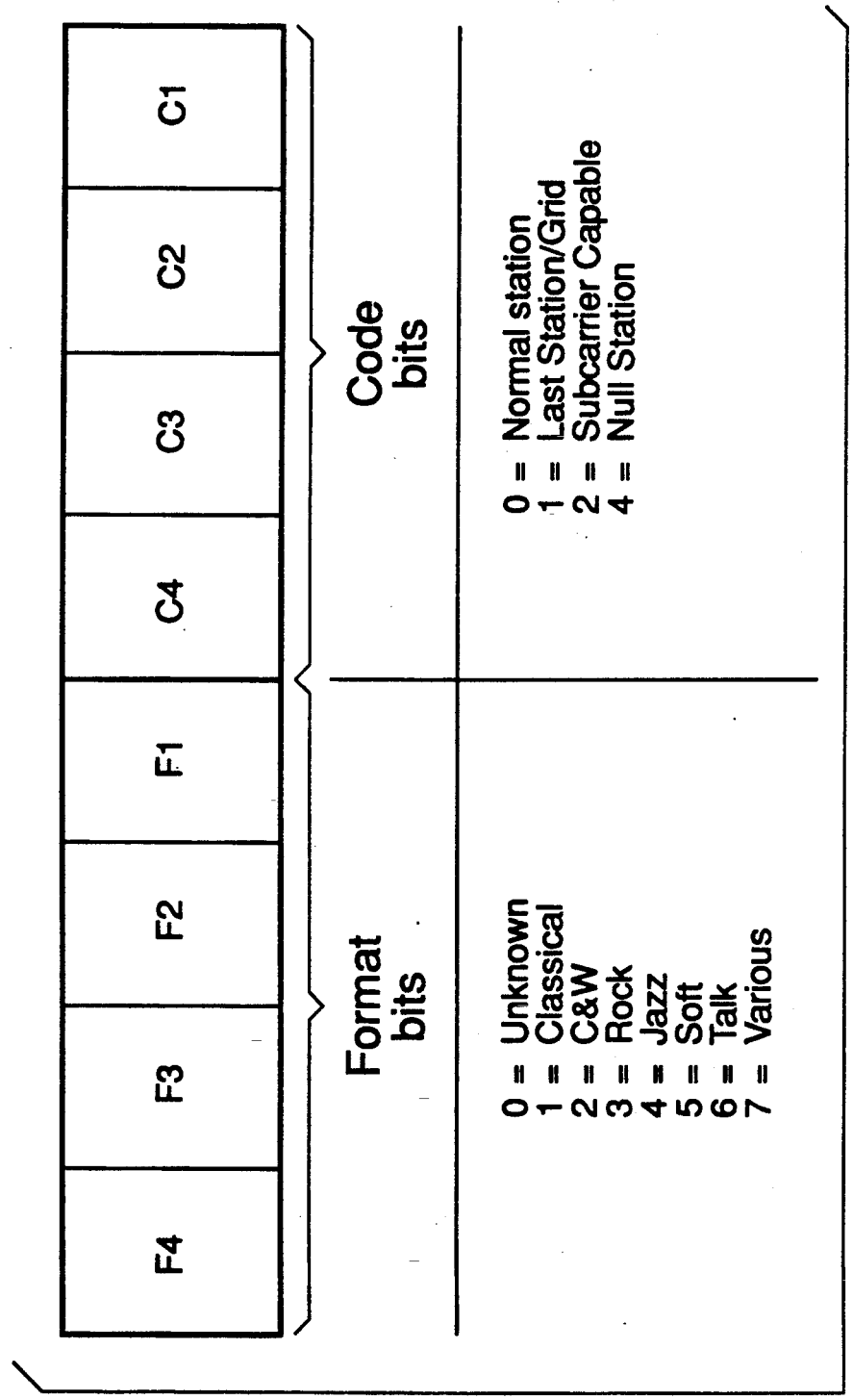
FIG. 23 is a diagram illustrating an example of an organization of bits to form codes to be stored in Read-Only Memory (ROM) to practice the invention.

FIG. 23 illustrates in more detail the format byte described in FIG. 10 which itself is part of station identifying records 919 and 924 described in FIG. 9. The present invention requires that the receiver know which station to tune to in its current market to "download" the updated data. This method allows updating even if there is only one FM subcarrier-capable station in each market.

The high nibble comprising bits Fl to F4 contains the format code of the station as shown in FIG. 10. Four bits allow up to 16 formats to be coded.

The low nibble comprising bits C1 to C4 contains other codes. If all bits C1 to C4 are reset (0), then the station is "normal". If bit Cl is set (1), then the corresponding station is the last station (the station with the highest frequency) in its particular grid. If bit C2 is set, this indicates that the corresponding station is subcarrier-capable and that it offers updated data in its data stream. If bit C4 is set, this indicates that the station is a "null" station: a station that is not on-the-air. This type of "null"entry in the original database 3 of FIG. 20, allows the addition of new stations to the database after ROM 3 of FIG. 20 has been programmed. One can, for example, add one or two such "null" stations to each grid to prepare for the eventuality of one or two new station coming on the air in each grid after the receiver is manufactured. Other bit organizations are, of course, possible.

Figure 24:
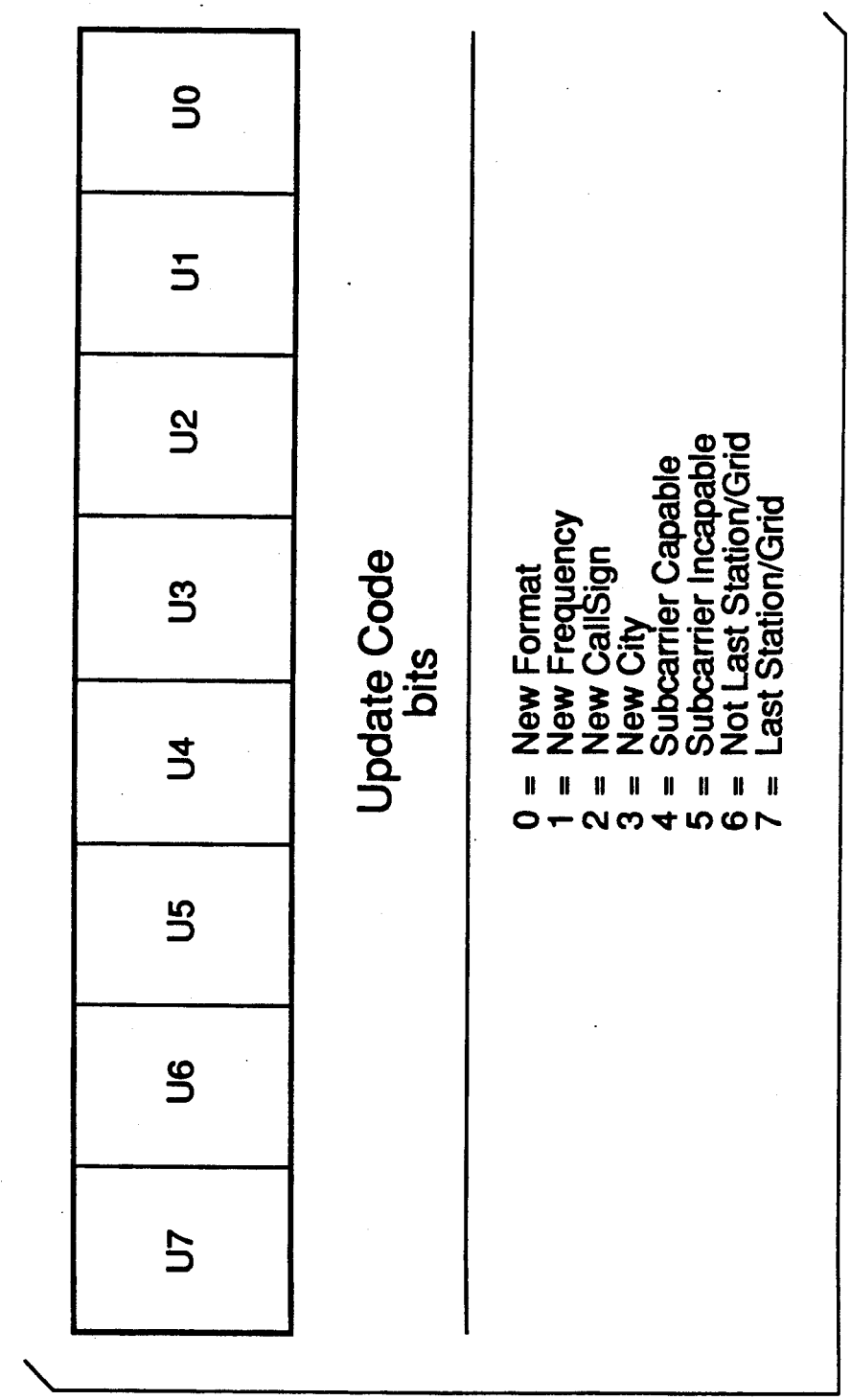
FIG. 24 is a diagram illustrating an example of an organization of bits to form codes to be stored in Random-Access Memory (RAM) to practice the invention.

FIG. 24 illustrates a possible bit arrangement in the code byte 37 of FIG. 21. Each bit is labeled U0 to U7. This code, as described in relation to FIG. 21, indicates to processor 2 in FIG. 20 the actual nature of the superseded data, its length and relationship to the original record.

Each code is chosen to be exclusive so that one code byte can describe several codes at the same time. For example, if bit U0 and U2 are set (1), this would indicate that the station had changed both its format and its call sign. The processor would then know that data bytes 38 following code byte 37 of FIG. 21 would include both types of data, thus their nature and their length. This arrangement allows the updated data to be stored sequentially in area 34 of FIG. 21 in non-fixed-length records, thereby saving data transmission time and memory space.

Bit U4 is specially noteworthy as it allows the receiver to "learn" of new FM subcarrier-capable stations coming on the air after the receiver is manufactured. Likewise bit U5 is offered to tell the receiver that a previously subcarrier-capable station is no longer transmitting update data. Note also that this type of information would also be stored in the updated format byte as described in FIG. 23.

PROGRAM STEPS

Figure 25:
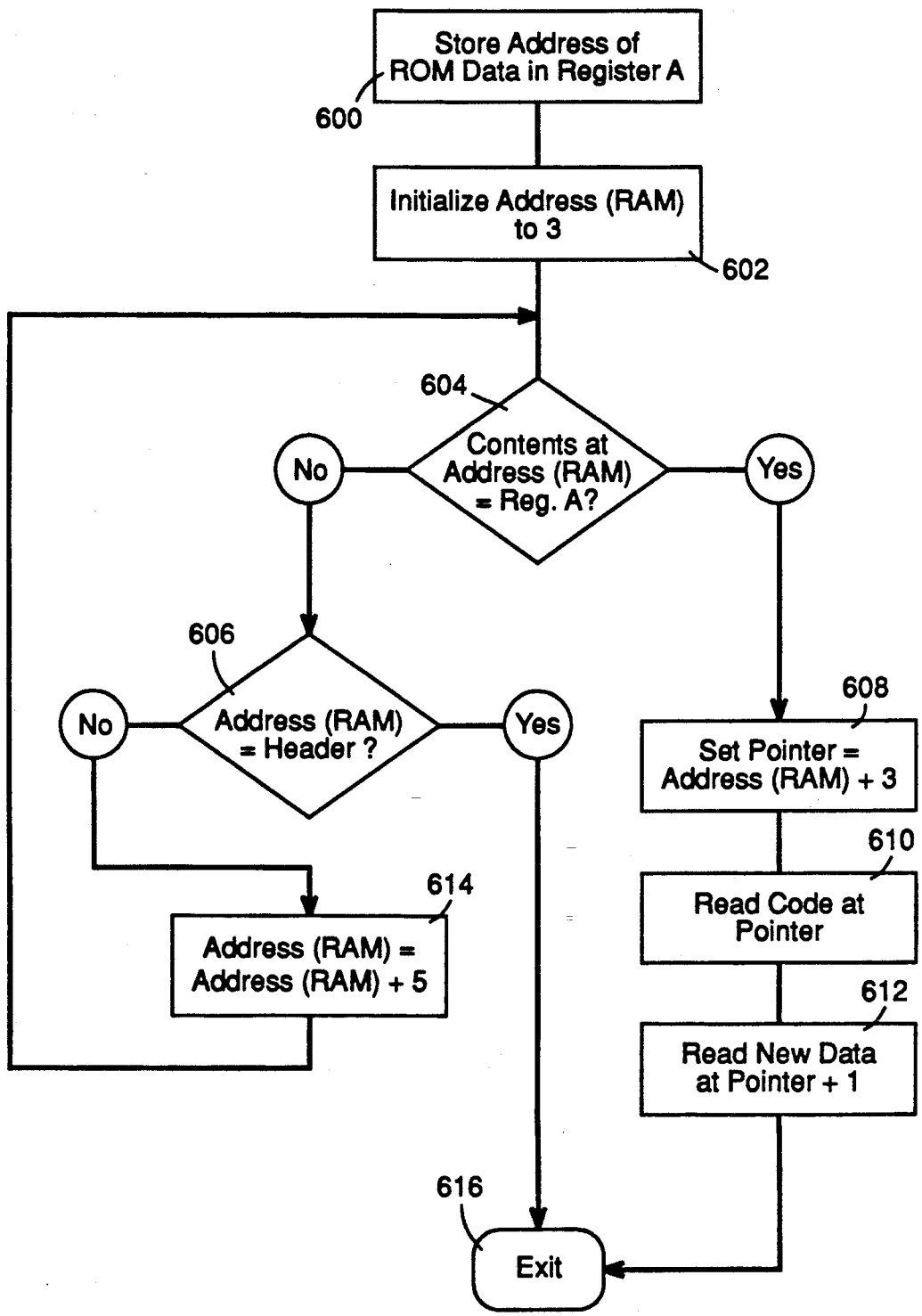
FIG. 25 is a flow diagram illustrating a program that scans for superseded data and which retrieves the updated data.

FIG. 25 is a flow diagram illustrating a program that scans for superseded data and retrieves the updated data. This program is used by processor 2 in FIG. 20 whenever it retrieves station information from the database 3. As soon as a record at Address(ROM) is read from database 3, the processor stores Address(ROM) in a register labeled A at step 600. At step 602, the processor initializes Address(RAM) to 3 (past the header 32 of FIG. 21, assuming the header is 3-bytes long). At step 604, the processor compares the contents of RAM 42' of FIG. 21 at Address(RAM) to Address(ROM) in register A. If there is a match, this means that some or all of the information read from the record at Address(ROM) has been superseded. The processor then reads pointer 36 of FIG. 21 at step 608. This pointer points to code byte 37 in FIG. 21 and FIG. 24 which is read at step 610. The information in the code byte, as described in FIG. 24, tells the processor what kind and length of information is stored next to the pointer (Pointer+1), in data byte or bytes 38 of FIG. 21. The information is then read at step 612 before exiting the procedure at step 616 where that information replaces the superseded information read from the ROM.

If on the other hand the address match at step 604 is negative, Address(RAM) is compared to the contents of the header 32 of FIG. 21 to see if there are more addresses in the list. If there is a match (the header contains the address of the last address-pointer pair in the list 33 of FIG. 21) then the procedure is exited at step 616 and the ROM data is used. If there is no match at step 606, then the address register Address(RAM) is incremented by 5 (assuming address-pointer pairs require 5 bytes each) and the program loops back to step 604 to check if the contents of the RAM at the new Address(RAM) matches Address(ROM).

It is possible to use well known database management techniques to speed up the search for matching addresses and to determine if a record in ROM needs to be updated or not. For example, a simple list of flag-bits (one for each station) can be constructed in RAM to indicate the currency of the ROM data. Such a bit list can be scanned extremely quickly thereby saving processing time during database access as an economical flag-bit list of 1K bytes can serve over 8000 station records.

Figure 26:
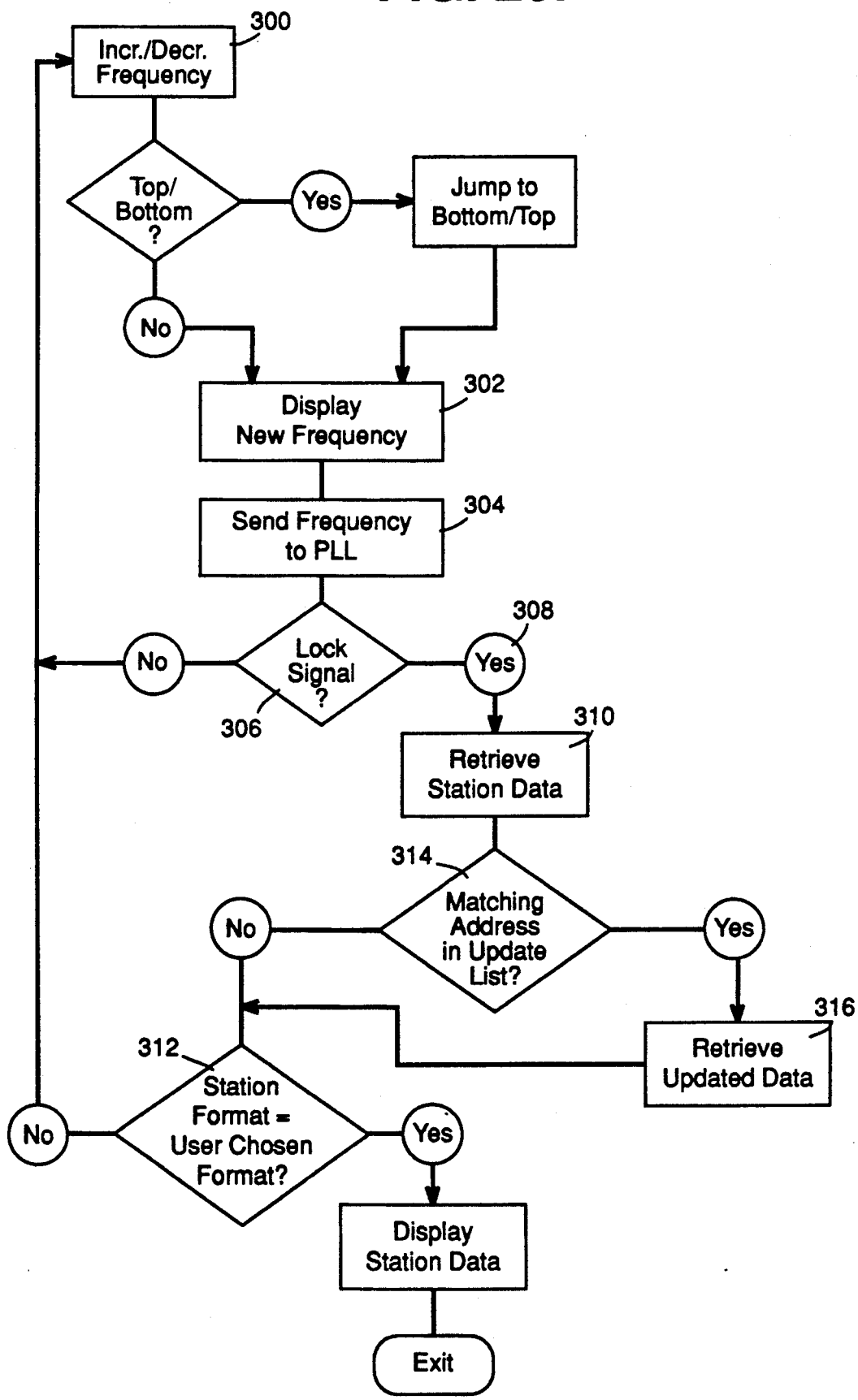
FIG. 26 is a flow diagram for a program that scans a database stored in the receiver of FIG. 20 which also scans for updated data to permit selective reception of available stations based on user preferred attribute such as station format.

FIG. 26 illustrates the two steps (highlighted) which are added to the flow chart described in FIG. 7 for the purpose of scanning stations by formats or other attributes. The numbering of FIG. 7 has been preserved. The two new steps 314 and 316 indicate where the program described in the preceding FIG. 25 would be inserted. Step 314 which corresponds to step 604 of FIG. 25 comes immediately after the retrieval of station data from the ROM at step 310 of FIG. 7. As explained before for FIG. 25 if the Address(ROM) is contained in the list 33 of FIG. 21, then the new data is read at step 316 as explained in FIG. 25.

Figure 19:
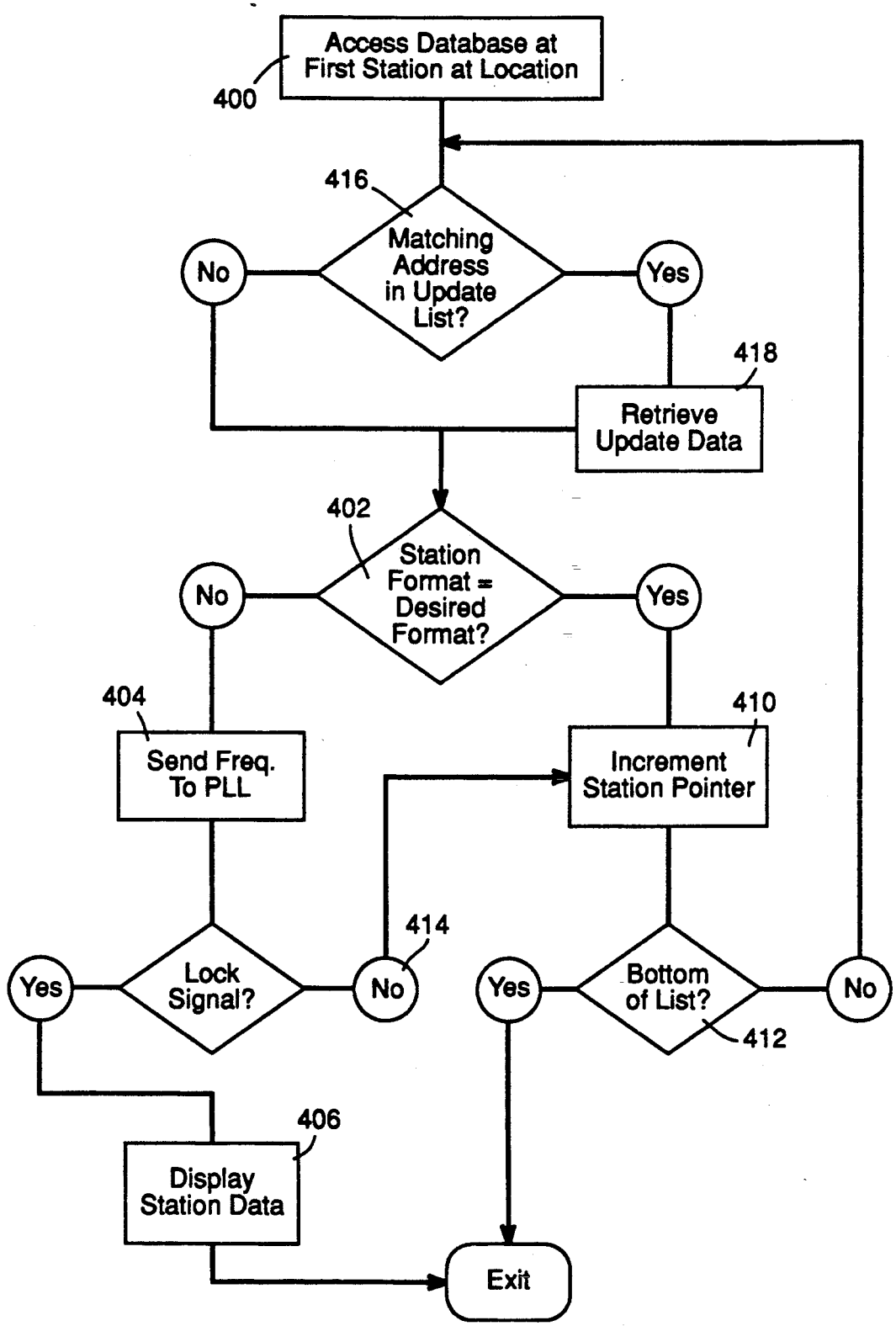
FIG. 19 is a flow diagram for an alternative program to that shown in FIG. 26 that scans the database for updated data prior to frequency selection to permit selective reception of available stations based on user preferred attribute such as station format.

FIG. 19 illustrates the two steps (highlighted) which are added to the flow chart described in FIG. 8 which is an alternative method for the purpose of scanning stations by formats or other attributes. The numbering of FIG. 8 has been preserved. The two new steps 416 and 418 indicate where the program described in the preceding FIG. 25 comes immediately after the retrieval of station data from the ROM at step 400 of FIG. 8 or the reading of the data after the increment of the station pointer at step 410. As explained before for FIG. 25 if the station pointer is contained in the list 33 of FIG. 21, then the new data is read at step 418 as explained in FIG. 25.

ALTERNATIVE MEMORY MEANS ARRANGEMENT

The preceding description of the update database organization and associated program steps can be simplified and speeded-up considerably, at a cost-to-speed trade off, if the original database is stored in Random-Access-Memory (RAM) or some other read/write type memory means. The problem, of course, is that such memory means are usually volatile (they loose their contents when power is removed) and require a constant power supply. It is however possible, in certain applications where the system is always connected to a power supply, or when the memory means are of a read/write but non-volatile type, such as bubble-memory for example, to eliminate the time required to check an address list as described with respect to FIG. 25 each time a record is accessed: the updated data, can immediately replace the original outdated data in that read/write memory means. Such a system would only require the updated data to reside in an extra RAM memory means between the time of reception and the time of update of the main memory means. That extra RAM can even be removed if the processor can decode and store the updating data in its proper location in the main database fast enough and immediately upon reception.

OPERATION

Once an update to the database as distributed by the manufacturer is known, the updating data as described for FIG. 21 or organized in another fashion but recognizable by CPU 2 of FIG. 20, can be transmitted by a VHF/FM station (the "data provider") through a subcarrier to the receiver.

The data is first encoded into a bit stream which is then modulated into the subcarrier. The subcarrier is then added to the main broadcast FM or TV aural carrier by frequency domain multiplexing which allows the additional subchannels to be separated from each other and from the main channel by use of specific frequency bands for each subchannel.

There are various subcarrier techniques described in the literature. The RDS technique as described in the public domain technical journal described above is referred to here as an illustration of one possible technique. Any technique permitting the inaudible insertion of auxiliary data information into a monophonic or stereophonic VHF/FM broadcast using the frequency range assigned to FM or TV broadcasts can likewise be used as long as there is a match with the data extracting method used in the receivers.

The recovery of the updated data can be either totally transparent to the user, semi-automatic such as clock-prompted, or user-prompted. As recited above, one of the benefits of the invention stems from the fact that this method requires at least but also only one data providing station per market. This means that the receiver must "know" which of the several stations in its current market it should tune to to receive the updated data. This is accomplished by inserting a flag in the database as shown in FIG. 23. This flag tells the receiver which station in its current market is a possible source of the update data.

The receiver could contain two separate tuning systems: one for normal radio broadcast receipt, the other always available to tune to the nearest updated data provider. Other methods are available, in which only one tuning system is necessary. One such method would simply tune the receiver immediately upon being turned on to the closest data provider. This method would require that the data providing station always transmit the updated data stream. Another method would require that the data providing station transmit such updated information at regular intervals, once a day at 00:00 AM for example, or every two hours on the hour, and so on, and that the receivers tune to their data providing station automatically at that time to receive the updated information. This method would require that each receiver be equipped with an internal clock to know when to make the tuning switch to receive the data. Another method would require the user to press a dedicated key 220 on the front panel as illustrated in FIG. 22.

To ensure proper reception even in case the internal clocks are not exactly on time or in case of transient poor reception conditions, the data provider must transmit the data stream several times, one after the other, repeating each stream, say, 500 times per transmission loop. For example, the RDS system transmits at a bit-rate of 1187.5 Hz (bits/second) and organizes its data in such a manner that a radio text segment of 64 bytes could be sent every 87.6 ms. The subcarrier would thus be used only for a few minutes at each transmission loop.

The receiver would require to be tuned to the data provider for only a few seconds within these transmitting loops to receive a complete update of its current market, in all bands. It is also possible to send an update for the whole database representing a whole continent although updates by regions might be more practical. For example, the whole North American continent, could be divided into regions to limit the worst-case time required to download all updates and still afford the user with an updated database for a long driving trip.

The data needs to be encoded in such a way as to determine the start and stop of each segment within each loop. This is easily done with a recognizable header. If a system such as RDS is used, each segment of the loop is also followed immediately by a checksum word which permits automatic data integrity checking as described in the RDS specifications.

Of course, while the receiver is receiving the subcarrier data, it also receives the normal audio contents of the main channel. This audio can be made available to the user or, if desired, the audio can either be blanked or a synthesized voice can announce that it is updating the database. That information can likewise be displayed on the display means. As soon as the updated data reception has been completed, the receiver can resume reception of the normal program of any other station.

As the data comes in the subcarrier, the subcarrier is recovered from the signal output by the VHF/FM demodulator (available as the multiplex signal input), separated by a frequency-specific band pass filter (57 kHz for RDS), demodulated and finally decoded before being stored in the update memory means.

As explained above, the updated data can either be stored in an update memory means to be later accessed every time a station record is read from the original database, or in case the original database is stored in a read/write memory means, the updated data can immediately replace its corresponding outdated data in that read/write memory means—thereby eliminating any further needs to access an extra set of data.

TELEVISION RECEIVER

The same features can be implemented in a television receiver. This is particularly advantageous in cable television installations where changes in data describing the broadcasting stations occur rapidly.

CABLE-FED UPDATING

The current invention can also be expressed in an alternative embodiment, particularly well suited to broadcast receivers which are always or periodically connected to a data source in which the updating data is fed by cable to the receiver.

It is possible to practice the invention in an embodiment in which the data is "piped in" through a dedicated port. For example, in the case of car radio receivers, a dedicated port can be used any time the vehicle is being serviced. Since more and more of the internal functions of the modern vehicle are electronically controlled or monitored, vehicle manufacturers, such as Chrysler, are thinking of offering a special port accessible to service personnel through which all such electronics could be "refreshed". In this case, the updating data destined for memory means 3 or 42 of FIG. 20 would simply be made a part of the data stream available during such servicing. In this alternative embodiment, there would be no need for the subcarrier demodulator 40 and subcarrier decoder 41 of FIG. 20. Instead the port referred to above would be made accessible directly to CPU 2 for storage in the memory means 3 or 42 of FIG. 20.

What is claimed is:

1. A broadcast receiver system comprising:
   a receiver for receiving a plurality of frequencies broadcast from a plurality of geographic regions;
   tuning means for tuning said receiver to one of the plurality of broadcast frequencies for reception thereof;
   memory means for storing a database of information in one or more band files relating to frequencies broadcast into each of the plurality of geographic regions, said information including data identifying attributes of each frequency broadcast into each geographic region;

input means for inputting a geographic region corresponding to a location of said broadcast receiver system and a datum representing a desired attribute;

searching means responsive to the inputted geographic region and the inputted datum representing the desired attribute for searching said one or more band files for a frequency broadcast into the geographic region of said broadcast receiver system having the desired attribute;

display means for displaying the frequency and the desired attribute for the broadcast frequency identified by said searching means; and data receiving means for receiving updating data to update said database in said memory means.

2. A broadcast receiver system as recited in claim 1, wherein the updating data is stored in a memory means separate from said memory means containing said database.

3. A broadcast receiver system as recited in claim 1, wherein the updating data replaces outdated data in said memory means.

4. A broadcast receiver system as recited in claim 1, wherein the data identifying attributes of each frequency broadcast into each geographic region stored in the database includes a call sign, a network affiliation, a program format, a language, and a geographical region.

5. A television broadcast receiver system comprising:
a receiver for receiving a plurality of frequencies broadcast from a plurality of geographic regions;

tuning means for tuning said receiver to one of the plurality of broadcast frequencies for reception thereof;

memory means for storing a database of information in one or more band files relating to frequencies broadcast into each of the plurality of geographic regions, said information including data identifying attributes of each frequency broadcast into each geographic region;

input means for inputting a geographic region corresponding to a location of said television broadcast receiver system and a datum representing a desired attribute searching means responsive to the inputted geographic region and the inputted datum representing the desired attribute for searching said one or more band files for a frequency broadcast into the geographic region of said television broadcast receiver system having the desired attribute;

display means for displaying the frequency and the desired attribute for the broadcast frequency identified by said searching means; and data receiving means for receiving updating data to update said database in said memory means.

6. A television broadcast receiver system as recited in claim 5, wherein the updating data is stored in memory means separate from said memory means containing said database.

7. A television broadcast receiver system as recited in claim 3, wherein the updating data replaces outdated data in said memory means.

8. A television broadcast receiver system as recited in claim 5, wherein the data identifying attributes of each frequency broadcast into each geographical region stored in the database includes a call sign, a network affiliation, a program format, a language, and a geographical region.

9. A television broadcast receiver system comprising:
a receiver for receiving a plurality of frequencies broadcast from a plurality of geographic regions;

tuning means for tuning said receiver to one of the plurality of broadcast frequencies for reception thereof;

memory means for string a database of information relating to frequencies broadcast, said information including data identifying a network affiliation of each frequency broadcast;

input means for inputting a datum representing a desired network affiliation;

searching means responsive to the inputted datum representing the desired network affiliation for searching the database for a broadcast frequency received by said television broadcast receiver system having the desired network affiliation;

display means for displaying the frequency and the network affiliation for the broadcast frequency identified by said searching means; and data receiving means for receiving updating data to update said database in said memory means.

10. A television broadcast receiver system comprising:
a receiver for receiving a plurality of frequencies broadcast from a plurality of geographic regions;

tuning means for tuning said receiver to one of the plurality of broadcast frequencies for reception thereof;

memory means for storing a database of information relating to frequencies broadcast, said information including data identifying a call sign of each frequency broadcast;

input means for inputting a datum representing a desired call sign;

searching means responsive to the inputted datum representing the desired call sign for searching the database for a broadcast frequency received by said television broadcast receiver system having the desired call sign;

display means for displaying the frequency and the call sign for the broadcast frequency identified by said searching means; and data receiving means for receiving updating data to update said database in said memory means.

* * * * *

UNITED STATES PATENT AND TRADEMARK OFFICE
CERTIFICATE OF CORRECTION

PATENT NO. : 5,152,011
DATED : September 29, 1992
INVENTOR(S) : PIERRE R. SCHWOB It is certified that error appears in the above-indentified patent and that said Letters Patent is hereby corrected as shown below:

COLUMN 1

Line 43, "receives," should read --receivers,--.

COLUMN 4

Line 43, "I." should be deleted.

COLUMN 5

Line 51, "displayed" should read --displayed.--.

COLUMN 11

Line 2, "CTTIES file 252." should read --CITIES file 252.--.

COLUMN 16

Line 54, "P>=H-L" should read --P<=H-L--.

COLUMN 17

Line 17, "it changes" should read --they change--.

COLUMN 20

Line 11, "has" should read --have--.

UNITED STATES PATENT AND TRADEMARK OFFICE
CERTIFICATE OF CORRECTION

PATENT NO. : 5,152,011
DATED : September 29, 1992
INVENTOR(S) : PIERRE R. SCHWOB It is certified that error appears in the above-indentified patent and that said Letters Patent is hereby corrected as shown below:

<u>COLUMN 26</u>

```
Line 4, "claim 3" should read --claim 5,--.
Line 18, "string" should read --storing--.
```

Signed and Sealed this

Fourteenth Day of December, 1993

*Attest:*

BRUCE LEHMAN

*Attesting Officer*     *Commissioner of Patents and Trademarks*